United States Patent
Ryu et al.

(10) Patent No.: US 11,822,248 B2
(45) Date of Patent: Nov. 21, 2023

(54) COATING COMPOSITIONS FOR USE WITH AN OVERCOATED PHOTORESIST

(71) Applicant: Rohm and Haas Electronic Materials Korea Ltd., Cheonan, Chungcheongnam-Do (KR)

(72) Inventors: Eui-Hyun Ryu, Chungcheongnam-Do (KR); Jin Hong Park, Gyeonggi-Do (KR); You Rim Shin, Gyeonggi-Do (KR); Ji-Hon Kang, Gyeonggi-Do (KR); Jung-June Lee, Chungcheongnam-do (KR); Jae-Bong Lim, Chungcheongnam-Do (KR)

(73) Assignee: ROHM AND HAAS ELECTRONIC MATERIALS KOREA LTD., Chungcheongnam-Do (KR)

( * ) Notice: Subject to any disclaimer, the term of this patent is extended or adjusted under 35 U.S.C. 154(b) by 0 days.

(21) Appl. No.: 15/337,558

(22) Filed: Oct. 28, 2016

(65) Prior Publication Data
US 2017/0123319 A1    May 4, 2017

Related U.S. Application Data

(60) Provisional application No. 62/249,197, filed on Oct. 31, 2015.

(51) Int. Cl.
| | |
|---|---|
| G03F 7/09 | (2006.01) |
| G03F 7/11 | (2006.01) |
| G03F 7/30 | (2006.01) |
| G03F 7/16 | (2006.01) |
| C09D 179/04 | (2006.01) |
| C09D 5/00 | (2006.01) |
| C08G 73/06 | (2006.01) |

(52) U.S. Cl.
CPC ............ *G03F 7/16* (2013.01); *C08G 73/0644* (2013.01); *C09D 5/006* (2013.01); *C09D 179/04* (2013.01); *G03F 7/091* (2013.01); *G03F 7/11* (2013.01)

(58) Field of Classification Search
CPC .................................. G03F 7/091; G03F 7/11
USPC ............................................. 430/271.1, 512
See application file for complete search history.

(56) References Cited

U.S. PATENT DOCUMENTS

| | | | |
|---|---|---|---|
| 5,128,232 A | 7/1992 | Thackeray et al. | |
| 6,261,743 B1 | 7/2001 | Pavelchek et al. | |
| 6,852,421 B2 | 2/2005 | Wayton et al. | |
| 7,691,556 B2 | 4/2010 | Wu et al. | |
| 7,968,268 B2 | 6/2011 | Wang | |
| 2004/0067437 A1* | 4/2004 | Wayton | G03F 7/091 430/271.1 |
| 2006/0057501 A1 | 3/2006 | Wu et al. | |
| 2010/0009297 A1 | 1/2010 | Yao et al. | |
| 2010/0092894 A1* | 4/2010 | Liu | G03F 7/091 430/325 |
| 2011/0033800 A1* | 2/2011 | Zampini | C07D 251/32 430/271.1 |
| 2011/0033801 A1* | 2/2011 | Zampini | C09D 167/02 430/271.1 |
| 2012/0202155 A1 | 8/2012 | Yao et al. | |

FOREIGN PATENT DOCUMENTS

| | | |
|---|---|---|
| EP | 0164248 A2 | 12/1985 |
| EP | 0783136 A2 | 7/1997 |
| EP | 0829766 A2 | 3/1998 |
| TW | 201002794 A | 1/2010 |
| TW | 201239047 A | 10/2012 |
| WO | 2010004378 A1 | 1/2010 |
| WO | 2010043946 A2 | 4/2010 |

OTHER PUBLICATIONS

English language summary of Office Action issued by Taiwan Intellectual Property Office dated Nov. 28, 2017 in counterpart TW106-2(6)01205-10621204820, 3 pages.
English language summary of Japanese Office Action dated Sep. 13, 2017 in counterpart Japanese Application 2016-209997, 3 pages.
English language summary of Korean Office Action dated Feb. 23, 2018 issued in counterpart Korean Application 10-2016-0141353, 2 pages.

* cited by examiner

*Primary Examiner* — John S Chu
(74) *Attorney, Agent, or Firm* — CANTOR COLBURN LLP

(57) ABSTRACT

Organic coating compositions, particularly antireflective coating compositions for use with an overcoated photoresist, are provided that in a first aspect comprise a crosslinker component that comprises a structure of the following Formula (I):

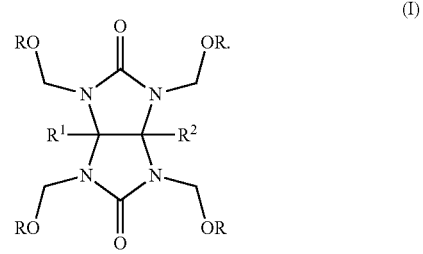

19 Claims, No Drawings

COATING COMPOSITIONS FOR USE WITH AN OVERCOATED PHOTORESIST

CROSS-REFERENCE TO RELATED APPLICATION

This application claims priority to U.S. Provisional Application No. 62/249,197, filed Oct. 31, 2015. The contents of the foregoing application is incorporated herein by reference in its entirety.

BACKGROUND

The present invention relates to compositions and, in particular, antireflective coating compositions for use in microelectronic application Compositions of the invention comprise a resin with covalently linked substituted glycoluril moieties. Preferred compositions of the invention are used with an overcoated photoresist composition and may be referred to as bottom antireflective compositions or "BARCs".

Photoresists are photosensitive films used for the transfer of images to a substrate. A coating layer of a photoresist is formed on a substrate and the photoresist layer is then exposed through a photomask to a source of activating radiation. Following exposure, the photoresist is developed to provide a relief image that permits selective processing of a substrate.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non-intended, again resulting in linewidth variations.

One approach used to reduce the problem of reflected radiation has been the use of a radiation absorbing layer interposed between the substrate surface and the photoresist coating layer. See US 76915556; US 2006057501; US 2011/0033801; JP05613950B2; JP05320624B2; and KR1270508B1.

For many high performance lithographic applications, particular antireflective compositions are utilized in order to provide the desired performance properties, such as optimal absorption properties and coating characteristics. See, for instance, the above-mentioned patent documents. Nevertheless, electronic device manufacturers continually seek increased resolution of a photoresist image patterned over antireflective coating layers and in turn demand ever-increasing performance from an antireflective composition.

It thus would be desirable to have new antireflective compositions for use with an overcoated photoresist. It would be particularly desirable to have new antireflective compositions that exhibit enhanced performance and could provide increased resolution of an image patterned into an overcoated photoresist.

SUMMARY

We now provide new coating compositions that can be used with overcoated photoresist compositions. In preferred aspects, coating compositions of the invention can function as an effective antireflective layer for an overcoated resist layer.

In preferred embodiments, organic coating compositions, particularly antireflective compositions for use with an overcoated photoresist, are provided that comprise a crosslinker component that exhibits comparatively enhanced solubility in organic carrier or formulation solvents.

More particularly, in a first aspect, coating compositions are provided that comprise a resin that comprises one or more one or more glycoluril groups that have a non-hydrogen substituent at the 1 and/or 5 glycoluril ring positions.

As referred to herein, the 1 and 5 ring positions of a glycoluril moiety are the two "core" carbons that each has one available valence available for substitution, as exemplified by the following structure (A):

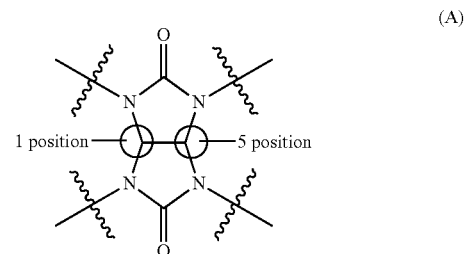

(A)

Preferably, in this first aspect, coating compositions are provided that comprises a resin that comprises one or more one or more glycoluril groups of the following Formula (I):

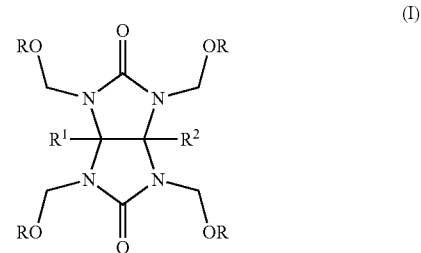

(I)

wherein in Formula (I):

at least one of $R^1$ and $R^2$ is other than hydrogen or a covalent linker to the resin (resin linker);

each R is independently selected from a covalent linker to the resin (resin linker), hydrogen, optionally substituted alkyl, optionally substituted heteroalkyl, optionally substituted carbocyclic aryl, or optionally substituted heteroaryl.

In Formula (I), preferred $R^1$ and $R^2$ groups include hydrogen, optionally substituted alkyl having from 1 to 20 carbons; optionally substituted alkoxy having 1 to 20 carbon atoms; optionally substituted aminoalkyl having 1 to 20 carbon atoms; optionally substituted alkylcarbocyclic aryl; optionally substituted alkylheteroaromatic. In this aspect, preferably both $R^1$ and $R^2$ are other than hydrogen or a resin linker. Preferred $R^1$ and $R^2$ groups include optionally substituted $C_{1-10}$ alkyl e.g. optionally substituted methyl, ethyl, propyl, butyl, pentyl or hexyl.

In Formula (I), preferred R groups include a resin linker, optionally substituted alkyl having from 1 to 20 carbons, and optionally substituted alkoxy having 1 to 20 carbon atoms; optionally substituted aminoalkyl having 1 to 20 carbon atoms; optionally substituted carbocyclic aryl; optionally substituted alkylcarbocyclic aryl; optionally substituted heteroaromatic; optionally substituted alkylheteroaromatic. Preferably at least one R group is a resin linker that provides a covalent linkage to a resin, i.e. so the glycoluril group is covalently linked to the resin. Preferably only one R group is a linker to provide covalent linkage to the resin. Preferred R groups have at least 2, 3, 4 or more carbon atoms. Preferably, an at least one R group is a resin linker, and more preferably only one R group is a resin linker, and one or both of $R^1$ and $R^2$ are other than a resin linker.

In a second aspect, coating compositions are provided that comprise a resin that comprises one or more one or more glycoluril groups that comprise one or more extended N-substituents, including resins of the following Formula (II):

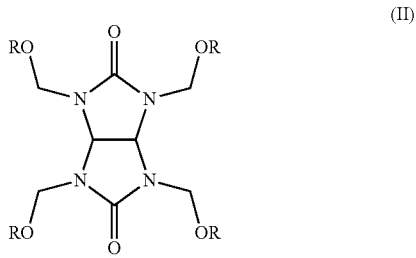

wherein in Formula (II):

each R is independently selected from a covalent linker to the resin (resin linker), hydrogen, optionally substituted alkyl having at least 4 carbon atoms, optionally substituted heteroalkyl having at least 4 carbon atoms, optionally substituted heteroalkyl having at least 4 carbon atoms, optionally substituted carbocyclic aryl, or optionally substituted heteroaryl.

In Formula (II), at least one R group, and preferably only one R group, is a covalent linker that provides a covalent linkage to a resin, i.e. so the glycoluril group is covalently linked to the resin. In Formula (II), preferred optionally substituted alkyl and heteroalkyl groups may have more than 4 carbon atoms, including 5, 6, 7, 8, 9 10 or more carbon atoms and may comprise carbon alicyclic groups and heteroalicyclic groups. In Formula (II), preferred optionally substituted carbocyclic aryl and optionally substituted heteroaryl will be ring-substituted with groups may be ring-substituted with one or more optionally substituted alkyl or heteroalkyl groups suitably having 1 to 20 carbon atoms.

In the present resins with pendant covalently linked glycoluril groups, a variety of covalent linkages (resin linker) may be employed between the resin backbone and the glycoluril moiety, including optionally substituted $C_{1-20}$alkylene and optionally substituted $C_{1-20}$heteroalkylene, particularly ether linkages containing one or more oxygen atoms and one or more carbon atoms. Preferred resin linkers include optionally substituted $C_{1-6}$alkylene such as optionally substituted —$(CH_2)_n$— where n is an integer of from 1 to 10, preferably optionally substituted —$(CH_2)$—, optionally substituted —$(CH_2CH_2)$—, optionally substituted —$(CH_2CH_2CH_2)$— and optionally substituted —$(CH_2CH_2CH_2CH_2)_n$—. It is understood that references herein to "covalent linker to the resin", "resin linker" or other similar term refers to a moiety that provides covalent linkage between the glycoluril moiety and the resin backbone, i.e. the resin linker is covalently linked to both the glycoluril moiety and the resin. If the glycoluril is part of the resin backbone, the glycoluril of the above Formulae suitably may comprise at least two resin linkers. If the glycoluril is a pendant moiety of the resin backbone, the glycoluril of the above Formulae suitably may comprise a single resin linker, although one or more additional resin linkers also may be suitable.

For both the first and second aspects, the resin with one or more covalently linked glycoluril groups preferably comprises polyester linkages. Further preferred is where the resin with one or more covalently linked glycoluril groups comprises polymerized isocyanurate groups. Still further preferred is where the resin with one or more covalently linked glycoluril groups comprises polyester linkages and polymerized isocyanurate groups.

For antireflective applications, underlying compositions of the invention also preferably contain a component that comprises chromophore groups that can absorb undesired radiation used to expose the overcoated resist layer from reflecting back into the resist layer. The resin or crosslinker may comprise such chromophore groups, or a coating composition may comprise a further component that comprises suitable chromophore groups.

In use with an overcoated photoresist, a coating composition may be applied on a substrate such as a semiconductor wafer which may have one or more organic or inorganic coating layers thereon. The applied coating layer may be optionally thermally treated prior to overcoating with a photoresist layer. Such thermal treatment may cause hardening including crosslinking of the coating composition layer. Such crosslinking may include hardening and/or covalent-bonding forming reactions between one or more composition components and can modulate water contact angle of the coating composition layer.

Thereafter, a photoresist composition may be applied over the coating composition layer followed by imaging of the applied photoresist composition layer with patterned activating radiation and the imaged photoresist composition layer is developed to provide a photoresist relief image.

A variety of photoresists may be used in combination (i.e. overcoated) with a coating composition of the invention. Preferred photoresists for use with the underlying coating compositions of the invention are chemically-amplified resists, especially negative-tone photoresists that contain one or more photoactive compounds and a resin component that contains units that undergo a deblocking or cleavage reaction in the presence of photogenerated acid.

In preferred aspects, the photoresist composition is designed for a negative-tone resist where the light-exposed regions remains after development process, but positive tone development can be also employed to remove the exposed portions of the photoresist layer.

The invention further provides methods for forming a photoresist relief image and novel articles of manufacture comprising substrates (such as a microelectronic wafer substrate) coated with a coating composition of the invention alone or in combination with a photoresist composition. Resins of Formulae (I) and (II) also are provided.

Other aspects of the invention are disclosed infra.

DETAILED DESCRIPTION

Coating Compositions

As discussed above, in a preferred aspect, organic coating compositions, particularly antireflective compositions for use with an overcoated photoresist, are provided that comprise a resin-bound crosslinker component that can exhibit comparatively enhanced solubility in organic solvent carriers. See, for instance, the comparative results set forth in the examples which follow.

First Aspect

As discussed above, we provide coating compositions that comprise a resin that comprises one or more one or more glycoluril groups that have a non-hydrogen substituent at the 1 and/or 5 glycoluril ring positions. Preferred resins comprise one or more one or more glycoluril groups of the following Formula (I):

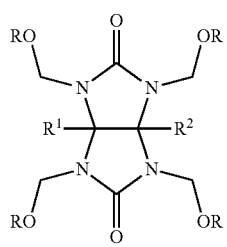

(I)

wherein in Formula (I) $R^1$, $R^2$ and each R is as defined above. Preferably, at least one R group is part of a covalent linkage to a resin (resin linker).

Preferred groups of Formula (I) include those of the following formulae 1, 2, 3, 4, 5, 6, 7 and 8:

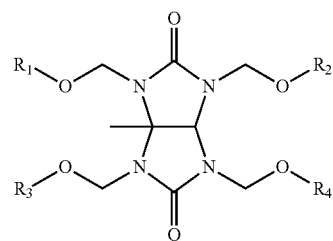

1

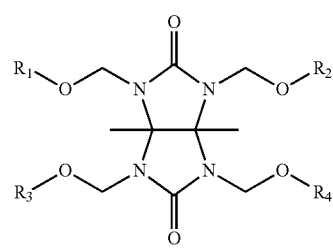

2

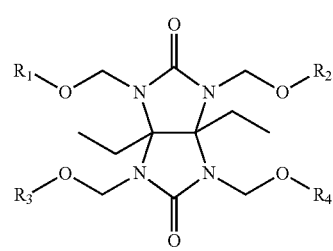

3

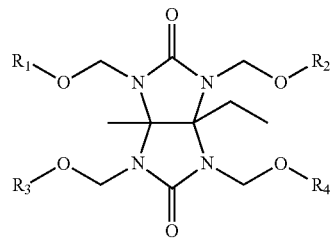

4

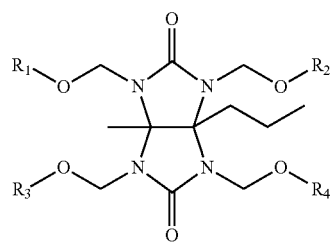

5

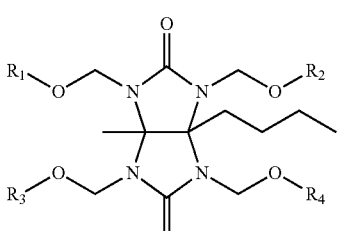

6

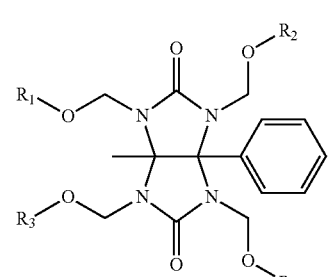

7

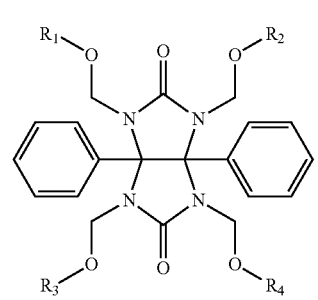

8 wherein in those above formulae 1, 2, 3, 4, 5, 6, 7 and 8, $R_1$, $R_2$, $R_3$ and $R_4$ are independently selected from the same group as defined for R in Formula (I) above and thus suitably may be for example linear or branch optionally substituted alkyl or heteroalkyl, including optionally substituted carbon alicyclic or optionally substituted heteroalicyclic, or optionally substituted carbocyclic aryl or optionally substituted heteroaromatic. $R_1$, $R_2$, $R_3$ and $R_4$ each may have one or more carbon atoms, typically 1 to about 20 carbon atoms, more typically 1 to 10 or 15 carbon atoms.

Specifically preferred groups of Formula (I) include the following (it is understood that in the following structures, one of the depicted R groups may serve as a covalent linkage to a resin at an available position of the depicted R group, or one of the depicted R groups may be substituted for another linker group to thereby provide covalent linkage to the resin):

Linear-type (i.e. where one or more R groups of Formula (I) have linear configuration):

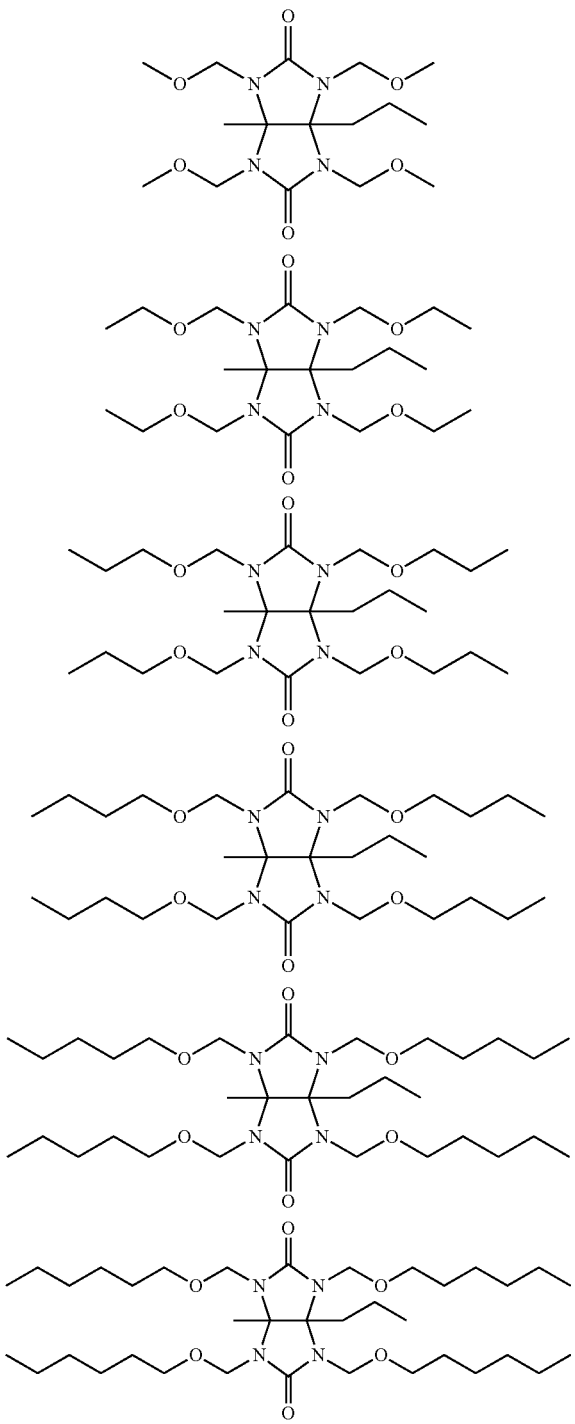

Branched-type (i.e. where one or more R groups of Formula (I) comprise a branched configuration):

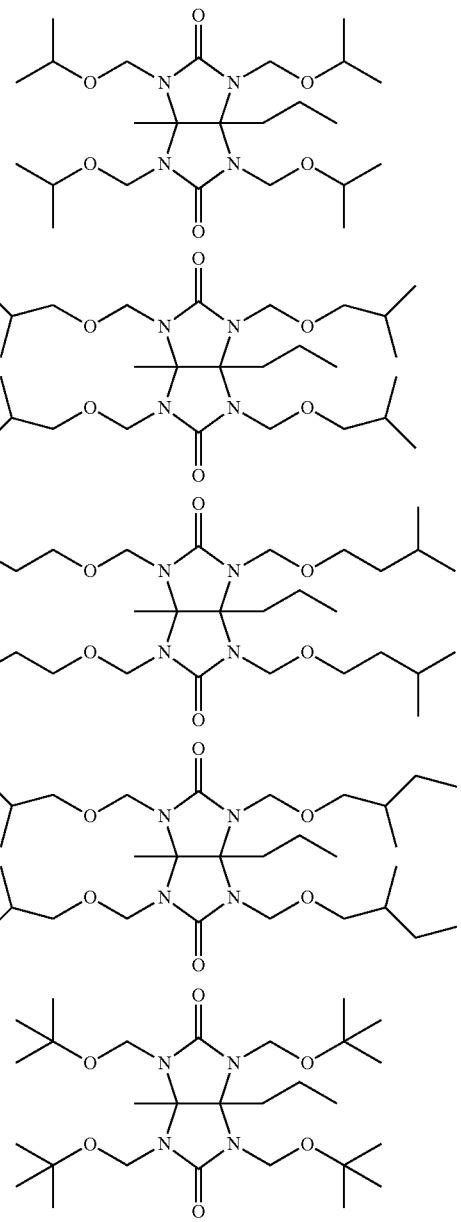

Cyclic-type (i.e. where one or more R groups of Formula (I) comprise an optionally substituted cyclic moiety, including an optionally substituted carbon alicyclic group such as optionally substituted cyclopentyl or optionally substituted cyclohexyl):

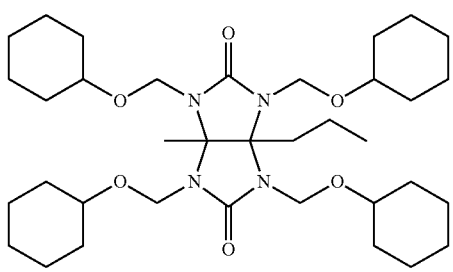

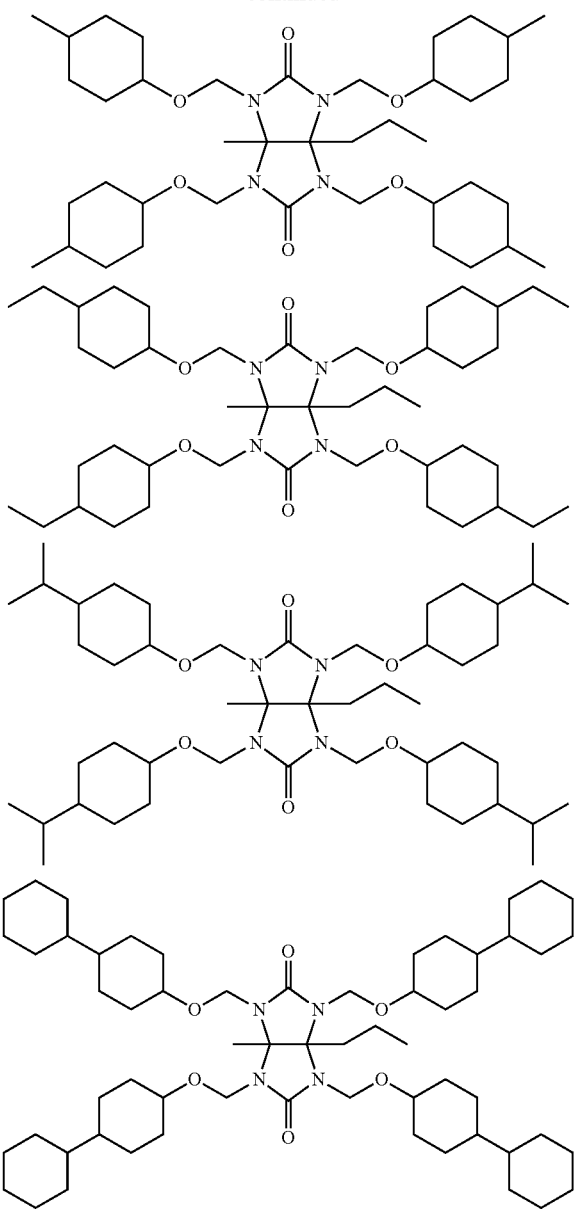

Aromatic-type (i.e. where one or more R groups of Formula (I) comprise an aromatic (carbocyclic aryl or heteroaromatic) moiety):

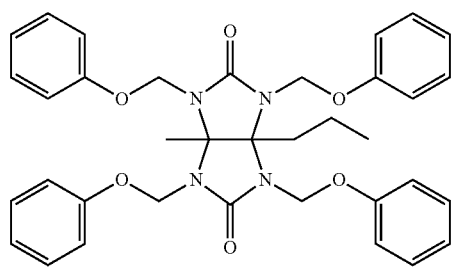

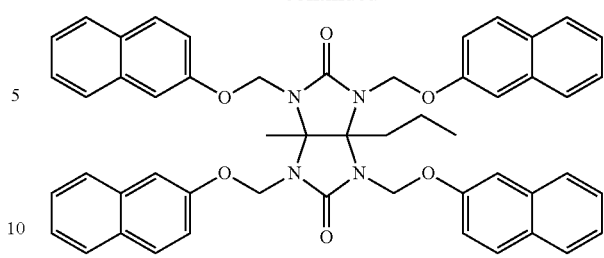

Heteroatom-containing or heteroalkyl (i.e. where one or more R groups of Formula (I) comprise a hetero-containing or heteroalkyl moiety such as optionally substituted alkoxy, optionally substituted alkylthio, or optionally substituted heteroalicyclic):

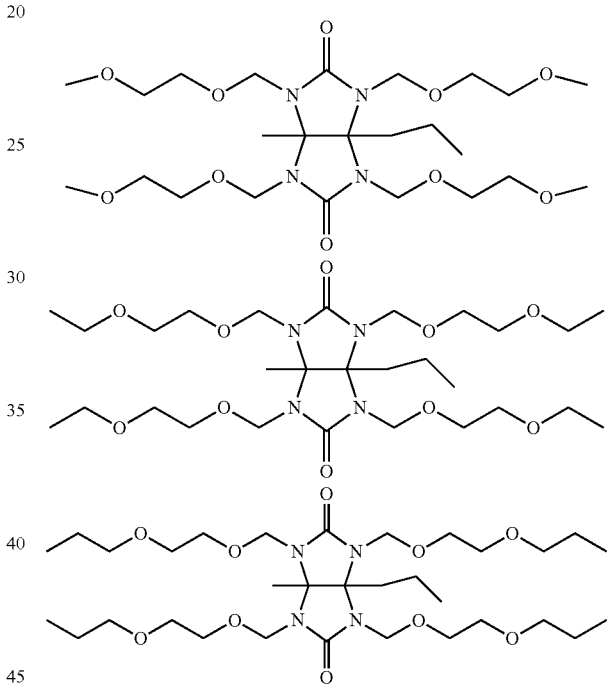

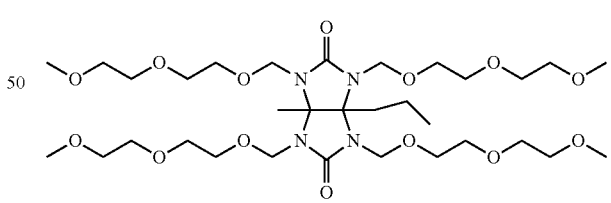

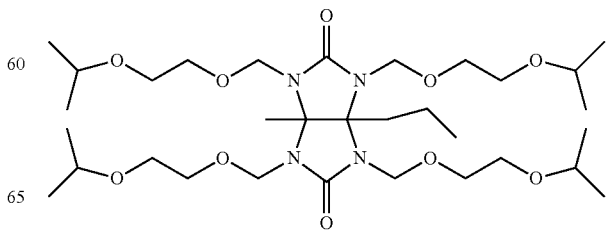

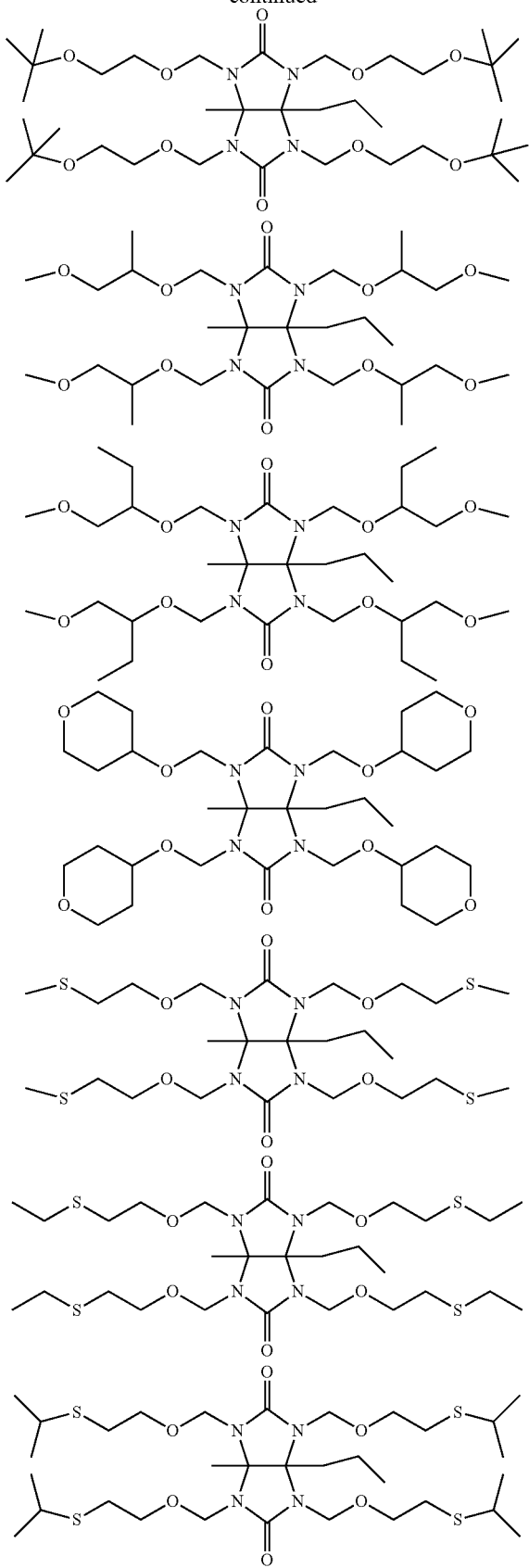

Second Aspect

As discussed above, in a second aspect, coating compositions are provided that comprise a resin that comprises one or more one or more glycoluril groups of the following Formula (II):

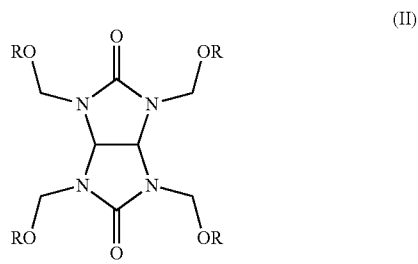

wherein in Formula (II) each R is as defined above. Preferably, at least one R group contains a total of at least 2, 3, 4, 5 or 6 carbon or hetero (N, O and/or S) atoms. For instance, specifically preferred R group include those that comprise an optionally substituted carbon alicyclic such as optionally substituted cyclohexyl. Preferably 2 or 3 R groups will contain a total of at least 4, 5 or 6 carbon or hetero (N, O, and/or S) atoms. In Formula (II), at least one R group, and preferably only one R group, is a linker group (resin linker) that provides a linkage to a resin, i.e. so the glycoluril group is covalently linked to the resin.

Specifically preferred groups of Formula (II) include the following (it is understood that in the following structures, one of the depicted R groups may serve as a covalent linkage to a resin (resin linker) at an available position of the depicted R group, or one of the depicted R groups may be substituted for another linker group to thereby provide covalent linkage to the resin):

Linear-type (i.e. where one or more R groups of Formula (II) have linear configuration):

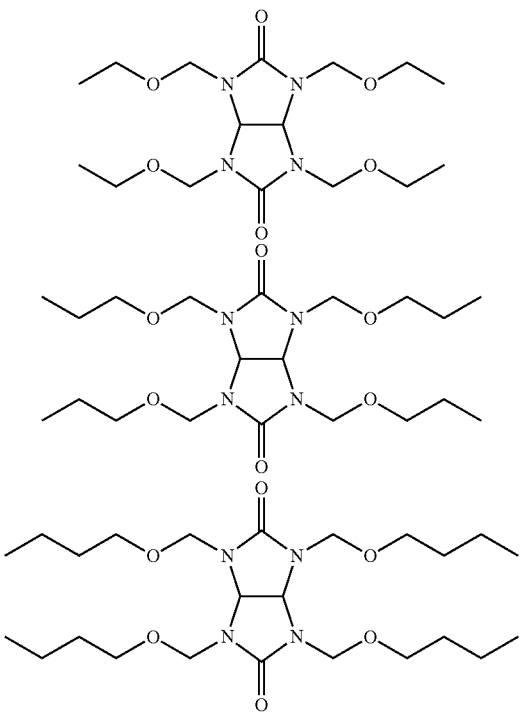

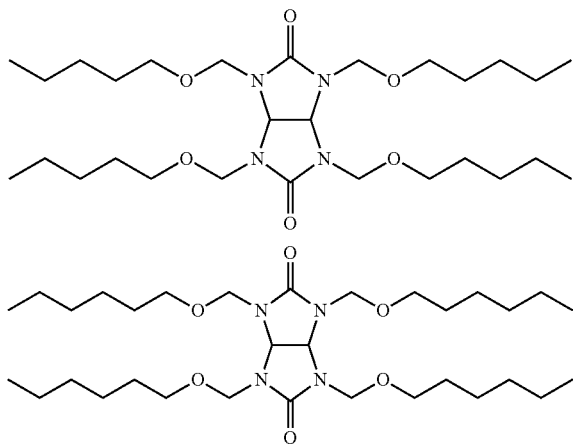
Branched-type (i.e. where one or more R groups of Formula (II) have branched configuration):
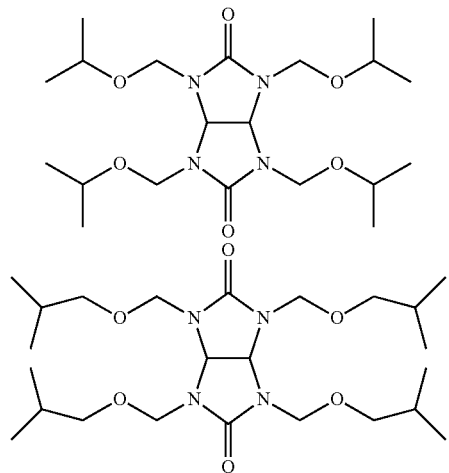
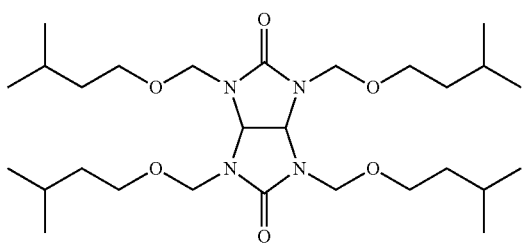
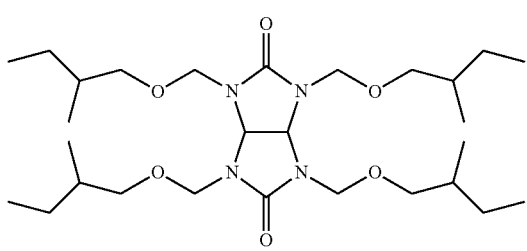
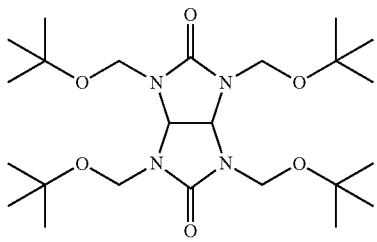
Cyclic-type (i.e. where one or more R groups of Formula (II) comprise an optionally substituted cyclic moiety, including an optionally substituted carbon alicyclic group such as optionally substituted cyclopentyl or optionally substituted cyclohexyl):
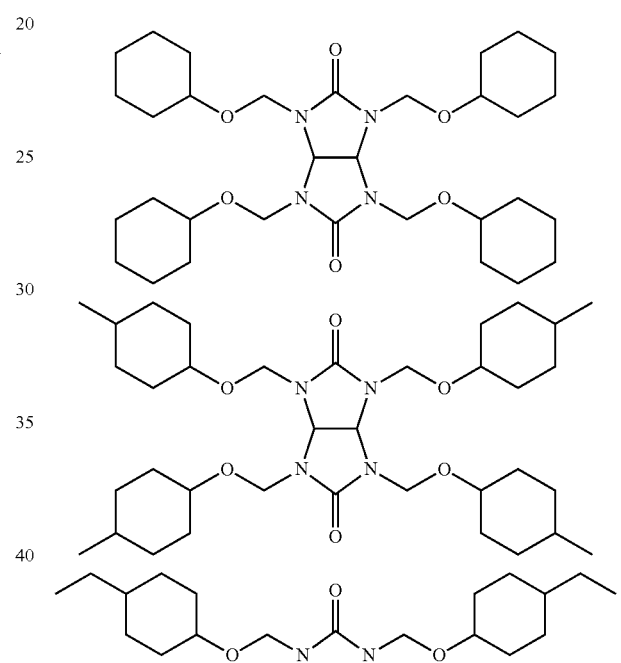

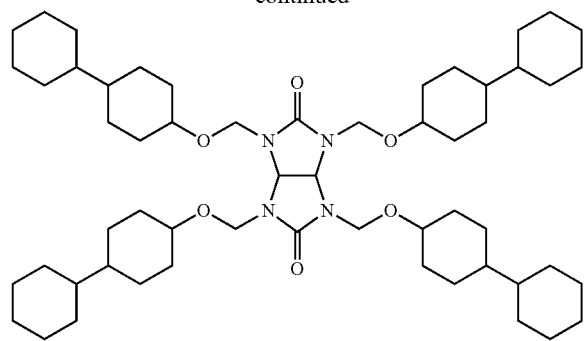

Aromatic-type (i.e. where one or more R groups of Formula (II) comprise an aromatic (carbocyclic aryl or heteroaromatic) moiety):

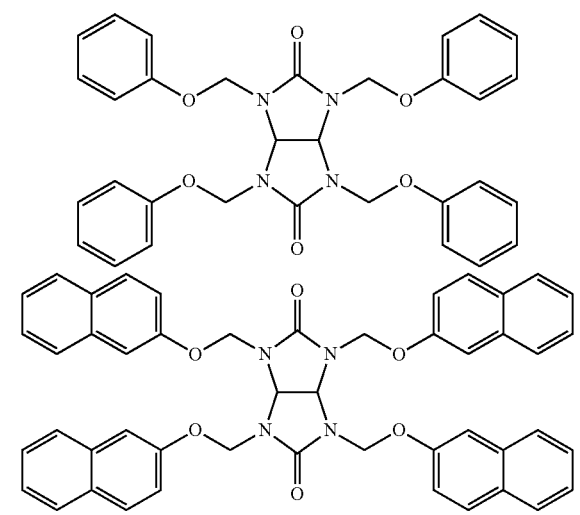

Heteroatom-containing or heteroalkyl (i.e. where one or more R groups of Formula (II) comprise a hetero-containing or heteroalkyl moiety such as optionally substituted alkoxy, optionally substituted alkylthio, or optionally substituted heteroalicyclic):

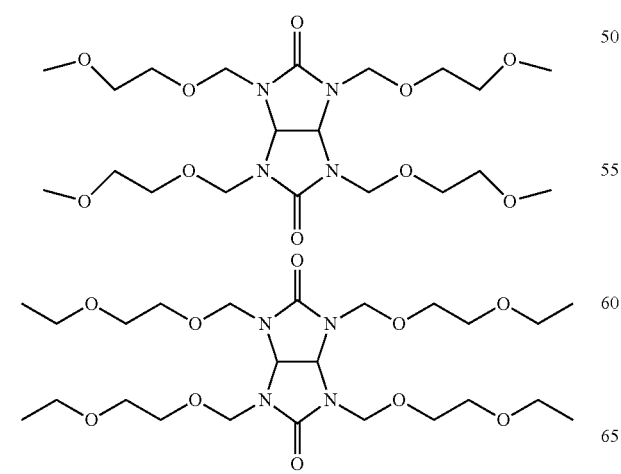

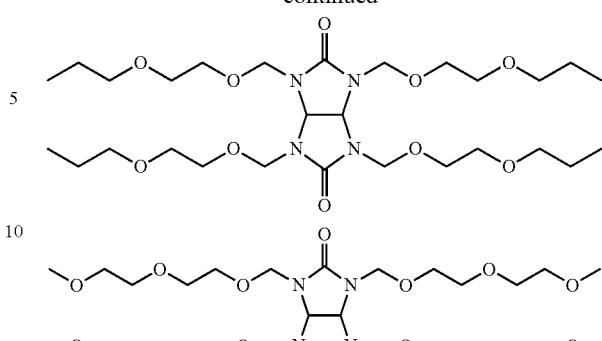

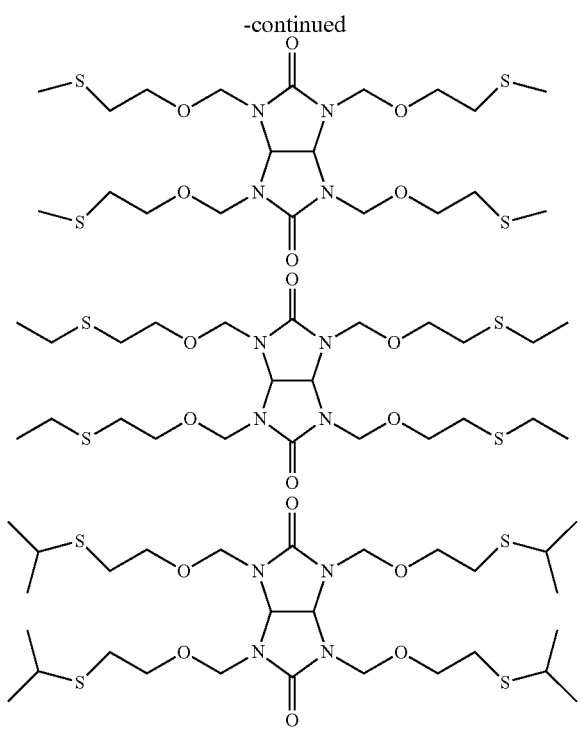

As referred to herein, suitable heteroalkyl groups include optionally substituted $C_{1-20}$alkoxy, optionally substituted alkylthio preferably having 1 to about 20 carbon atoms; optionally substituted alkylsulfinyl preferably 1 to about 20 carbon atoms; optionally substituted alkylsulfonyl preferably having 1 to about 20 carbon atoms; and optionally substituted alkylamine preferably having 1 to about 20 carbon atoms.

It is also understood that the term "heteroalkyl" includes "heteroalicyclic" groups unless otherwise indicated. Heteroalicyclic groups are non-aromatic ring groups that have one or more hetero (e.g. N, O or S) ring atoms. Preferred heteroalicyclic groups have 5 to 20 ring atoms and 1, 2 or 3 N, O or S ring atoms.

The term "alkyl" refers to the radical of saturated aliphatic groups, including straight-chain alkyl groups, branched-chain alkyl groups, cycloalkyl (alicyclic) groups, alkyl substituted cycloalkyl groups, and cycloalkyl substituted alkyl groups. In preferred aspects, a straight chain or branched chain alkyl has 30 or fewer carbon atoms in its backbone (e.g., $C_1$-$C_{30}$ for non-cyclic, $C_3$-$C_{30}$ for branched chain), preferably 26 or fewer, and more preferably 20 or fewer, and still more preferably 4 or fewer.

It is also understood that the term "alkyl" includes "carbon alicyclic" groups unless otherwise indicated.

As referred to herein, the term "carbon alicyclic" group means each ring member of the non-aromatic group is carbon. The carbon alicyclic group can have one or more endocyclic carbon-carbon double bonds, provided the ring is not aromatic. The term optionally substituted "cycloalkyl group" means each ring member of the non-aromatic group is carbon and the carbon ring does not have any endocyclic carbon-carbon double bonds. For instance, cyclohexyl, cyclopentyl and adamantyl are cycloalkyl groups as well as carbon alicyclic groups. Carbon alicyclic groups and cycloalkyl groups may comprise one ring or multiple (e.g. 2, 3, 4 or more) bridged, fused or otherwise covalently linked rings.

As referred to herein, a "heteroaryl" or "heteroaromatic" group includes an aromatic 5-8 membered monocyclic, 8-12 membered bicyclic, or 11-14 membered tricyclic ring system having 1-3 heteroatoms if monocyclic, 1-6 heteroatoms if bicyclic, or 1-9 heteroatoms if tricyclic, said heteroatoms selected from O, N, or S (e.g., carbon atoms and 1-3, 1-6, or 1-9 heteroatoms of N, O, or S if monocyclic, bicyclic, or tricyclic, respectively), wherein 0, 1, 2, 3, or 4 atoms of each ring may be substituted by a substituent. Examples of heteroaryl groups include pyridyl, furyl or furanyl, imidazolyl, benzimidazolyl, pyrimidinyl, thiophenyl or thienyl, quinolinyl, indolyl, thiazolyl, and the like.

As referred to herein, the term "carbocyclic aryl" includes groups having 5 to 20 or more carbon atoms and at least one aromatic ring where each atom of the aromatic ring is carbon, such as phenyl, naphthyl or anthracenyl.

Various materials and substituents (including groups R, $R^1$ and $R^2$ of Formulae (I) and (II) above) that are "optionally substituted" may be suitably substituted at one or more available positions by e.g. halogen (F, Cl, Br, I); nitro; hydroxy; amino; alkyl such as $C_{1-8}$ alkyl; alkenyl such as $C_{2-8}$ alkenyl; alkylamino such as $C_{1-8}$ alkylamino; carbocyclic aryl such as phenyl, naphthyl, anthracenyl, etc; and the like.

A variety of resins may serve as the resin components of an underlying coating composition.

Particularly preferred resins of coating compositions of the invention may comprise polyester linkages. Polyester resins can be readily prepared by reaction of one or more polyol reagents with one or more carboxy-containing (such as a carboxylic acid, ester, anhydride, etc.) compounds. Suitable polyol reagents include diols, glycerols and triols such as e.g. diols such as diol is ethylene glycol, 1,2-propylene glycol, 1,3-propylene glycol, butane diol, pentane diol, cyclobutyl diol, cyclopentyl diol, cyclohexyl diol, dimethylolcyclohexane, and triols such as glycerol, trimethylolethane, trimethylolpropane and the like.

Preferred polyester resins for use in an antireflective composition of the invention are also disclosed in U.S. Pat. No. 8,501,383; U.S. 2011/0033801; and U.S. Pat. No. 7,163,751. As disclosed in those patent documents, resins that contain ester repeat units (polyester) may be suitably provided by polymerization of a carboxy-containing compound (such as a carboxylic acid, ester, anhydride, etc.) and a hydroxy-containing compound, preferably a compound having multiple hydroxy groups such as a glycol, e.g. ethylene glycol or propylene glycol, or glycerol, or other diols, triols, tetraols and the like. In certain aspects, preferably, an ester functionality is present as a component of, or within, the polymer backbone rather than as a pendant or side chain unit. Ester moieties also may be present as a pendant group, but preferably the polymer also contains an ester functionality along the polymer backbone. Also preferred is where the ester repeat unit comprises aromatic substitution, such as optionally substituted carbocyclic aryl groups e.g. optionally substituted phenyl, naphthyl or anthracenyl substitution, either as a side chain or more preferably along the polymer backbone.

Resins of coating compositions of the invention may comprise a variety of additional groups such as cyanurate groups, as disclosed in U.S. Pat. Nos. 6,852,421 and 8,501,383.

Particularly preferred matrix resins of coating compositions of the invention may comprise one or more one or more cyanurate groups and polyester linkages.

As discussed, for antireflective applications, suitably one or more of the compounds reacted to form the resin comprise a moiety that can function as a chromophore to absorb radiation employed to expose an overcoated photoresist coating layer. For example, a phthalate compound (e.g. a phthalic acid or dialkyl phthalate (i.e. di-ester such as each ester having 1-6 carbon atoms, preferably a di-methyl or ethyl phthalate) may be polymerized with an aromatic or non-aromatic polyol and optionally other reactive compounds to provide a polyester particularly useful in a coating composition employed with a photoresist imaged at sub-200 nm wavelengths such as 193 nm. An isocyanurate compound also may be polymerzied with one or more polyols to provide a resin useful in the present underlying coating compositions. Resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$alkyl naphthalenedicarboxylate. Reactive anthracene compounds also are preferred, e.g. an anthracene compound having one or more carboxy or ester groups, such as one or more methyl ester or ethyl ester groups.

The compound that contains a chromophore unit also may contain one or preferably two or more hydroxy groups and be reacted with a carboxyl-containing compound. For example, a phenyl compound or anthracene compound having one, two or more hydroxyl groups may be reacted with a carboxyl-containing compound.

Additionally, underlying coating compositions that are employed for antireflective purposes may contain a material that contains chromophore units that is separate from a resin component that provides water contact angle modulation (e.g. a resin that contains photoacid-labile groups and/or base-reactive groups. For instance, the coating composition may comprise a polymeric or non-polymeric compound that contains phenyl, anthracene, naphthyl, etc. units. It is often preferred, however, that the one or more resins that provide water contact angle modulation also contain chromophore moieties.

Resins that comprise one or more glycoluril moieties as disclosed herein may be readily prepared. For instance, a glycoluril monomer or oligomer may be grafted onto a formed resin (prepolymer) to provide pendant glycoluril moieties. More specifically, for example, glycoluril monomers such as 1,3,4,6-tetrakis(methoxymethyl)tetrahydroimidazo[4,5-d]imidazole-2,5(1H,3H)-dione and/or 1,3,4,6-tetrakis(methoxymethyl)-3a-methyl-6a-propyltetrahydroimidazo[4,5-d]imidazole-2,5(1H,3H)-dione may be reacted with a formed resin under acidic conditions and elevated temperatures to covalently link the glycoluril group to the resin. See the examples which follow for preferred syntheses. Alternatively, a glycoluril monomer can be reacted with one or more other monomers to provide a copolymer with glycoluril repeat units in the resin chain. Such glycoluril monomers may have for example a pendant vinyl group for polymerization with other monomers.

Preferably resins of underlying coating compositions of the invention will have a weight average molecular weight (Mw) of about 1,000 to about 10,000,000 daltons, more typically about 2,000 to about 100,000 daltons, and a number average molecular weight (Mn) of about 500 to about 1,000,000 daltons. Molecular weights (either Mw or Mn) of the resins of compositions of the invention are suitably determined by gel permeation chromatography.

The resin component will be the major solids component of an underlying coating composition in many preferred embodiments. For instance, one or resins suitably may be present from 50 to 99.9 weight percent based on total solid content of a coating composition, more typically from 80 to 95 weight percent based total solid content of a coating composition. As referred to herein, solids of a coating composition refer to all materials of the coating composition except solvent carrier.

In certain embodiments, a coating composition of the invention may comprise a crosslinker in addition to a resin-bound glycoluril crosslinker as disclosed herein. For example, coating compositions may include amine-based crosslinkers such as melamine materials, including melamine resins such as manufactured by Cytec Industries and sold under the tradename of Cymel 300, 301, 303, 350, 370, 380, 1116 and 1130; glycolurils including those glycolurils available from Cytec Industries; and benzoquanamines and urea-based materials including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

A resin-bound glycoluril crosslinker component of a coating composition of the invention in general is present in an amount of between about 5 and 100 weight percent of total solids (all components except solvent carrier) of the coating composition. Thus, where one or more resin-linked glycolurils is the sole composition component, the resin will be present in an amount of 100 weight percent of total solids. In compositions where one or more resin-linked glycolurils are blended with other materials such as separate chromophore compounds, other resins that do not contain a glycoluril as disclosed herein, and the like, the one or more resin-linked glycolurils will be present in an amount of less than 100 weight percent total solids, but will be present in an amount of at least 5 weight percent and more preferably at least 10, 15, 20, 30, 40, 50, or 60 weight percent of total solids.

Preferred coating compositions of the invention also may contain a thermal acid generator compound. Thermal-induced crosslinking of the coating composition by activation of the thermal acid generator is generally preferred.

Suitable thermal acid generator compounds for use in a coating composition include ionic or substantially neutral thermal acid generators, e.g. an ammonium arenesulfonate salt (e.g. toluene sulfonic acid ammonium salt), for catalyzing or promoting crosslinking during curing of an antireflective composition coating layer. Typically one or more thermal acid generators are present in an coating composition in a concentration from about 0.1 to 10 percent by weight of the total of the dry components of the composition (all components except solvent carrier), more preferably about 0.5 to 2 percent by weight of the total dry components.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604, or the surfactant FC 171 or FC 431 available from the 3M Company.

Underlying coating compositions of the invention also may contain other materials such as a photoacid generator, including a photoacid generator as discussed for use with an overcoated photoresist composition. See U.S. Pat. No. 6,261,743 for a discussion of such use of a photoacid generator in an antireflective composition.

To make a liquid coating composition of the invention, the components of the coating composition are dissolved in a suitable solvent such as, for example, one or more oxyisobutyric acid esters particularly methyl-2-hydroxyisobutyrate, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solid content of an underlying coating composition varies from about 0.5 to 20 weight percent of the total weight of the coating composition, preferably the solid content varies from about 0.5 to 10 weight of the coating composition.

Exemplary Photoresist Systems

Photoresists for use with an underlying coating composition typically comprise a polymer and one or more acid generators. Generally preferred are positive-tone resists and the resist polymer has functional groups that impart alkaline aqueous solubility to the resist composition. For example, preferred are polymers that comprise polar functional groups such as hydroxyl or carboxylate, or acid-labile groups that can liberate such polar moieties upon lithographic processing. Preferably the polymer is used in a resist composition in an amount sufficient to render the resist developable with an aqueous alkaline solution.

Acid generators are also suitably used with polymers that comprise repeat units containing aromatic groups, such as optionally substituted phenyl including phenol, optionally substituted naphthyl, and optionally substituted anthracene. Optionally substituted phenyl (including phenol) containing polymers are particularly suitable for many resist systems, including those imaged with EUV and e-beam radiation. For positive-acting resists, the polymer also preferably contains one or more repeat units that comprise acid-labile groups. For example, in the case of polymers containing optionally substituted phenyl or other aromatic groups, a polymer may comprise repeat units that contain one or more acid-labile moieties such as a polymer that is formed by polymerization of monomers of an acrylate or methacrylate compound with acid-labile ester (e.g. t-butyl acrylate or t-butyl methacrylate). Such monomers may be copolymerized with one or more other monomers that comprise aromatic group(s) such as optionally phenyl, e.g. a styrene or vinyl phenol monomer.

Preferred monomers used for the formation of such polymers include: an acid-labile monomer having the following formula (V), a lactone-containing monomer of the following formula (VI), a base-soluble monomer of the following formula (VII) for adjusting dissolution rate in alkaline developer, and an acid-generating monomer of the following formula (VIII), or a combination comprising at least one of the foregoing monomers:

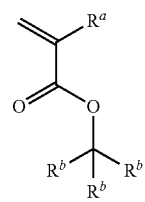

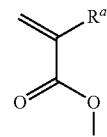

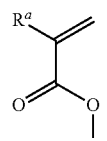

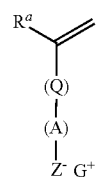

wherein each $R^a$ is independently H, F, —CN, $C_{1-10}$ alkyl, or $C_{1-10}$ fluoroalkyl. In the acid-deprotectable monomer of formula (V), $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure. In lactone-containing monomer of formula (VI), L is a monocyclic, polycyclic, or fused polycyclic $C_{4-20}$ lactone-containing group. In the base solubilizing monomer of formula (VII), W is a halogenated or non-halogenated, aromatic or non-aromatic $C_{2-50}$ hydroxyl-containing organic group having a pKa of less than or equal to 12. In the acid generating monomer of formula (VIII), Q is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non-ester-containing and fluorinated or non-fluorinated, and is $C_{1-20}$ alkyl, $C_{3-20}$ cycloalkyl, $C_{6-20}$ aryl, or $C_{7-20}$ aralkyl, $Z^-$ is an anionic moiety comprising carboxylate, sulfonate, an anion of a sulfonamide, or an anion of a sulfonimide, and $G^+$ is a sulfonium or iodonium cation.

Exemplary acid-deprotectable monomers include but are not limited to:

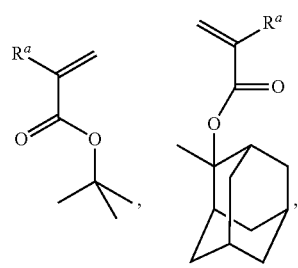

Exemplary lactone-containing monomers include:

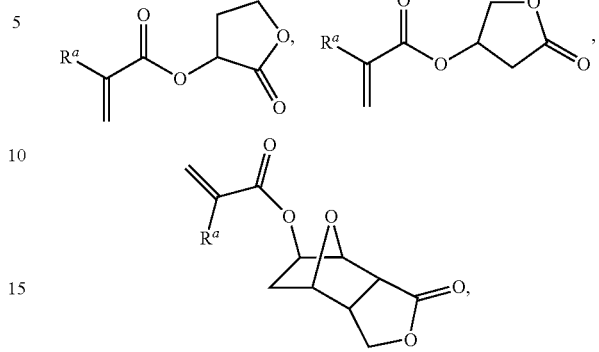

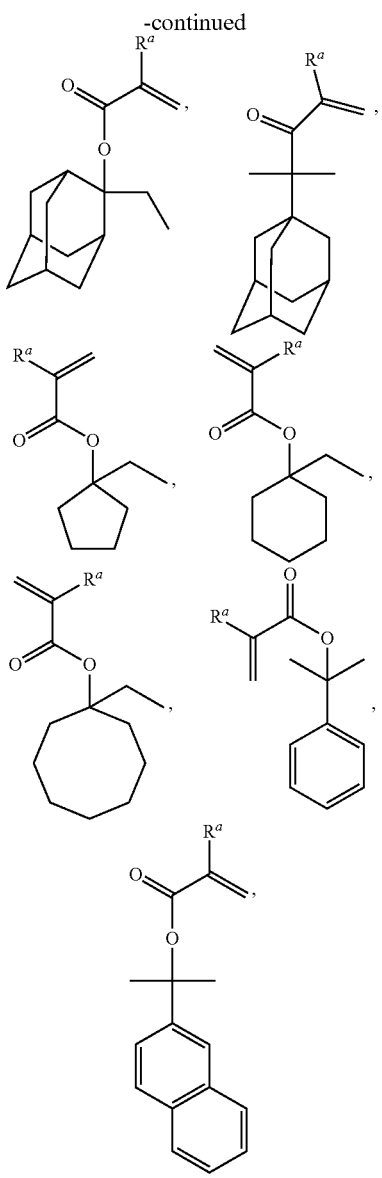

or a combination comprising at least one of the foregoing monomers, wherein $R^a$ is H, F, —CN, $C_{1-10}$ alkyl, or $C_{1-10}$ fluoroalkyl.

Suitable base-soluble monomers may be of the following formula (X):

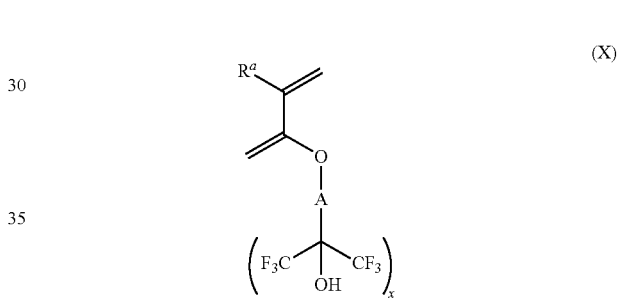

(X)

wherein each $R^a$ is independently H, F, —CN, $C_{1-10}$ alkyl, or $C_{1-10}$ fluoroalkyl, A is a hydroxyl-containing or non-hydroxyl containing, ester-containing or non ester-containing, fluorinated or non-fluorinated $C_{1-20}$ alkylene, $C_{3-20}$ cycloalkylene, $C_{6-20}$ arylene, or $C_{7-20}$ aralkylene, and x is an integer of from 0 to 4, wherein when x is 0, A is a hydroxyl-containing $C_{6-20}$ arylene.

Exemplary base soluble monomers include those having the following structures:

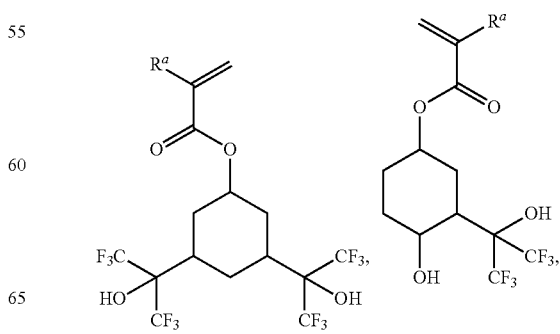

or a combination comprising at least one of the foregoing, wherein $R^a$ is H, F, —CN, $C_{1-6}$ alkyl, or $C_{1-6}$ fluoroalkyl.

Suitable lactone monomers may be of the following formula (IX):

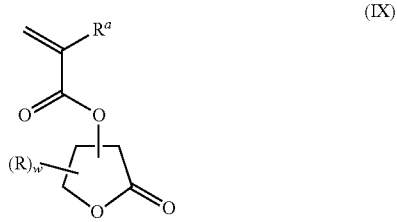

(IX)

wherein $R^a$ is H, F, —CN, $C_{1-6}$ alkyl, or $C_{1-6}$ fluoroalkyl, R is a $C_{1-10}$ alkyl, cycloalkyl, or heterocycloalkyl, and w is an integer of 0 to 5. In formula (IX), R is attached directly to the lactone ring or commonly attached to the lactone ring and/or one or more R groups, and the ester moiety is attached to the lactone ring directly, or indirectly through R.

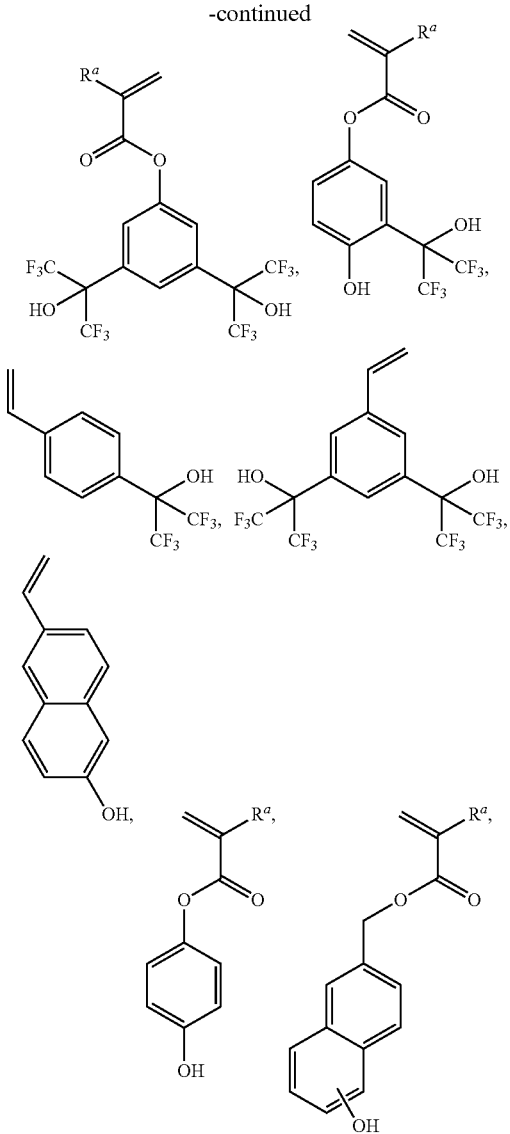

or a combination comprising at least one of the foregoing, wherein $R^a$ is H, F, —CN, $C_{1-6}$ alkyl, or $C_{1-6}$ fluoroalkyl.

Preferred acid generating monomers include those of the formulae (XI) or (XII):

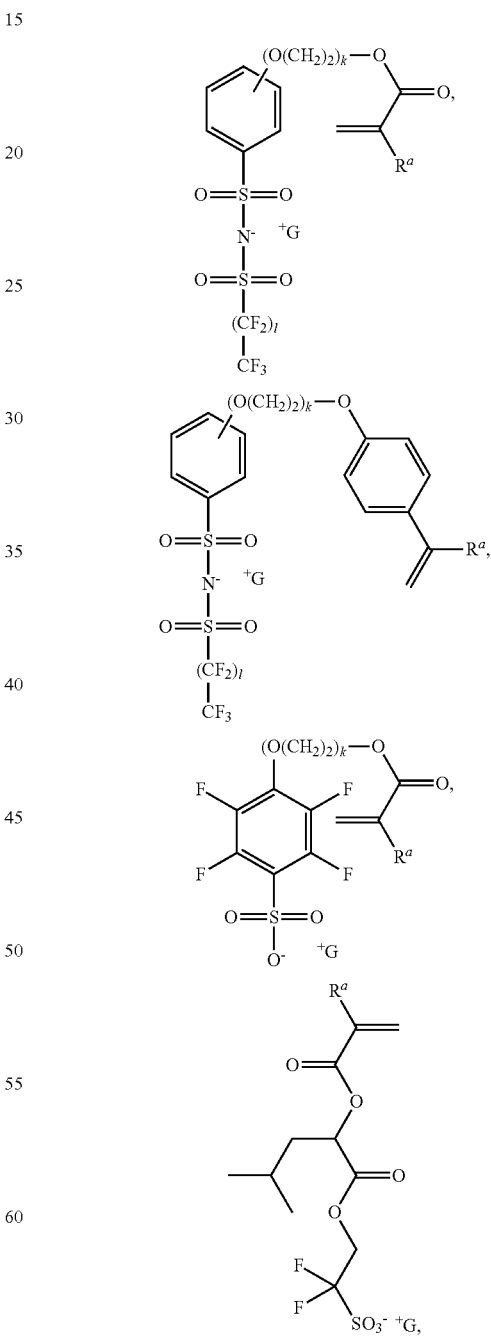

wherein each $R^a$ is independently H, F, —CN, $C_{1-6}$ alkyl, or $C_{1-6}$ fluoroalkyl, A is a fluorine-substituted $C_{1-30}$ alkylene group, a fluorine-substituted $C_{3-30}$ cycloalkylene group, a fluorine-substituted $C_{6-30}$ arylene group, or a fluorine-substituted $C_{7-30}$ alkylene-arylene group, and $G^+$ is a sulfonium or iodonium cation.

Preferably, in formulas (XI) and (XII), A is a —[(C$(R^1)_2)_xC(=O)O]_b$—C$((R^2)_2)_y(CF_2)_z$— group, or an o-, m- or p-substituted —$C_6F_4$— group, where each $R^1$ and $R^2$ are each independently H, F, —CN, $C_{1-6}$ fluoroalkyl, or $C_{1-6}$ alkyl, b is 0 or 1, x is an integer of 1 to 10, y and z are independently integers of from 0 to 10, and the sum of y+z is at least 1.

Exemplary preferred acid generating monomers include:

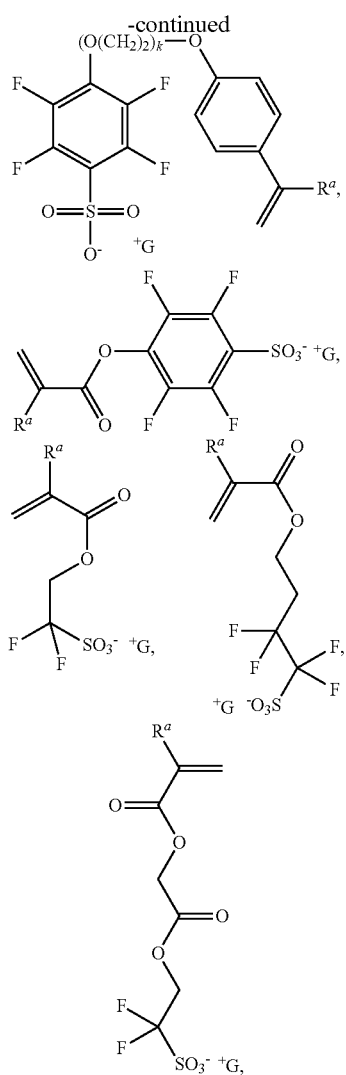

or a combination comprising at least one of the foregoing, where each $R^a$ is independently H, F, —CN, $C_{1-6}$ alkyl, or $C_{1-6}$ fluoroalkyl, k is suitably an integer of from 0 to 5; and $G^+$ is a sulfonium or iodonium cation. $G^+$ as referred to herein throughout the various formulae may be an acid generator as disclosed herein and comprise an oxo-dioxolane moiety and/or an oxo-dioxane moiety.

Preferred acid-generating monomers may include sulfonium or iodonium cation. Preferably, in formula (IV), $G^+$ is of the formula (XIII):

$$\overset{\oplus}{X}{-}(R^0)_a \qquad (XIII)$$

wherein X is S or I, each $R^0$ is halogenated or non-halogenated and is independently $C_{1-30}$ alkyl group; a polycyclic or monocyclic $C_{3-30}$ cycloalkyl group; a polycyclic or monocyclic $C_{4-30}$ aryl group; or a combination comprising at least one of the foregoing, wherein when X is S, one of the $R^0$ groups is optionally attached to one adjacent $R^0$ group by a single bond, and a is 2 or 3, wherein when X is I, a is 2, or when X is S, a is 3.

Exemplary acid generating monomers include those having the formulae:

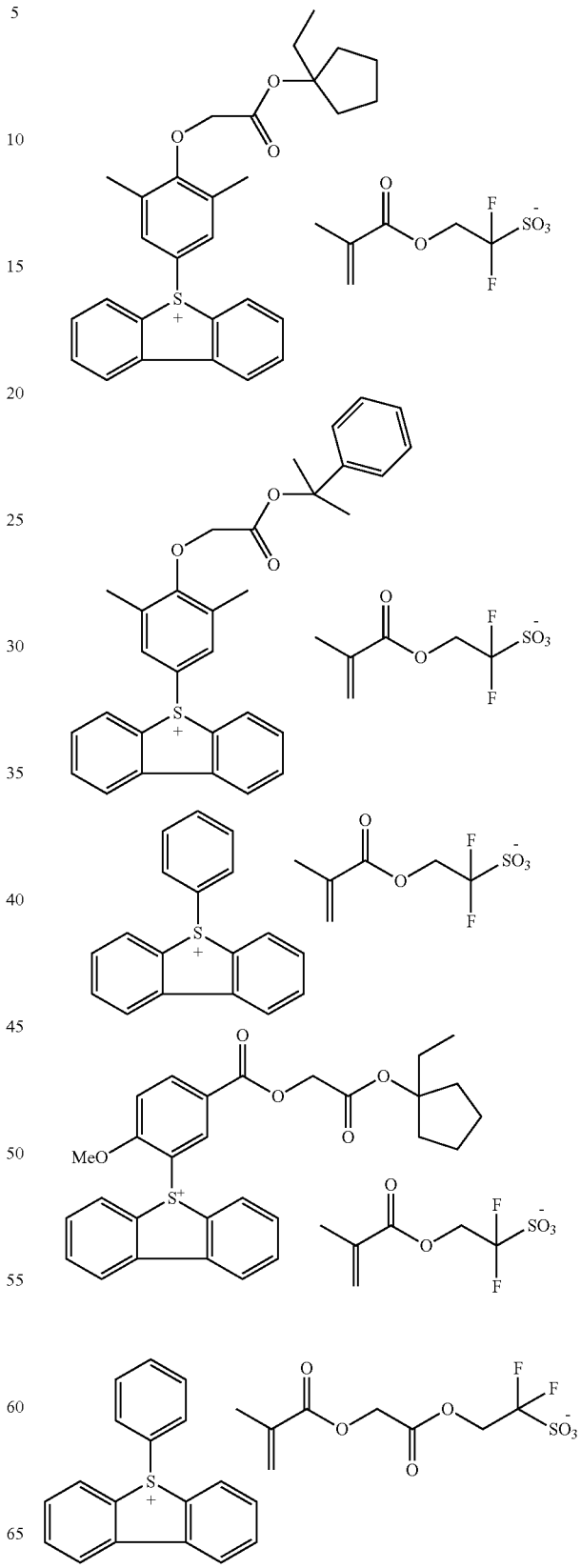

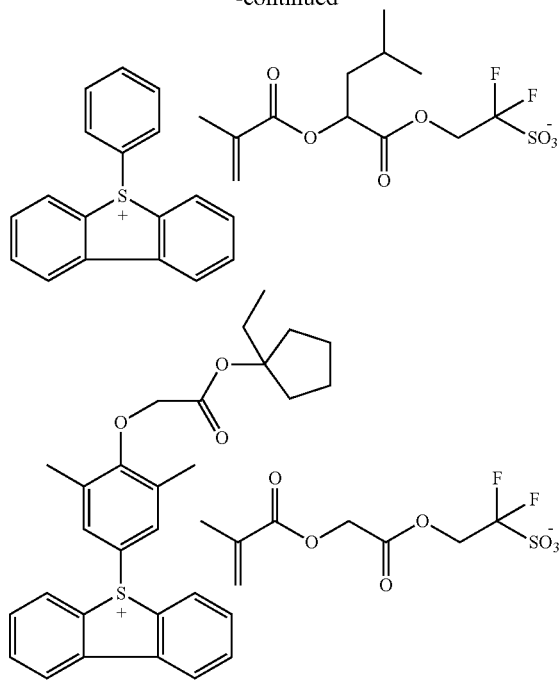

Specifically suitable polymers that have acid-labile deblocking groups for use in a positive-acting chemically-amplified photoresist of the invention have been disclosed in European Patent Application 0829766A2 (polymers with acetal and ketal polymers) and European Patent Application EP0783136A2 (terpolymers and other copolymers including units of 1) styrene; 2) hydroxystyrene; and 3) acid labile groups, particularly alkyl acrylate acid labile groups.

Additional preferred resins for use in photoresists to be imaged at sub-200 nm, such as at 193 nm, comprises units of the following general formulae (I), (II) and (III):

Preferred resins for use in photoresists to be imaged at sub-200 nm, such as at 193 nm, comprise units of the following general formulae (I), (II) and (III):

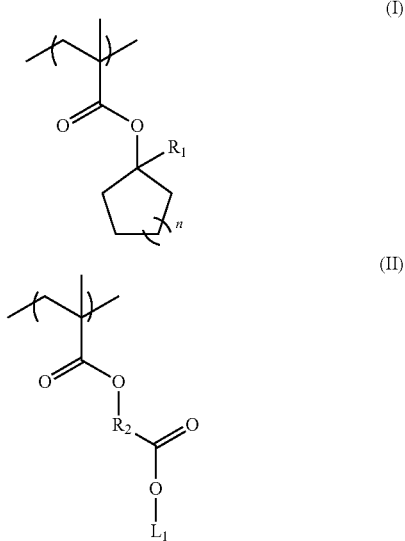

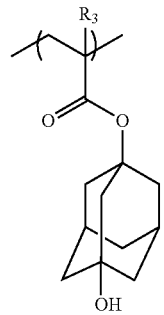

wherein: $R_1$ is a $(C_1$-$C_3)$alkyl group; $R_2$ is a $(C_1$-$C_3)$alkylene group; $L_1$ is a lactone group; and n is 1 or 2.

Polymers for use in photoresists of the invention may suitably vary widely in molecular weight and polydisperity. Suitable polymers include those that have an $M_w$ of from about 1,000 to about 50,000, more typically about 2,000 to about 30,000 with a molecular weight distribution of about 3 or less, more typically a molecular weight distribution of about 2 or less.

Preferred negative-acting compositions of the invention comprise a mixture of materials that will cure, crosslink or harden upon exposure to acid, and two or more acid generators as disclosed herein. Preferred negative acting compositions comprise a polymer binder such as a phenolic or non-aromatic polymer, a crosslinker component and a photoactive component of the invention. Such compositions and the use thereof have been disclosed in European Patent Applications 0164248 and U.S. Pat. No. 5,128,232 to Thackeray et al. Preferred phenolic polymers for use as the polymer binder component include novolaks and poly(vinylphenol)s such as those discussed above. Preferred crosslinkers include amine-based materials, including melamine, glycolurils, benzoguanamine-based materials and urea-based materials. Melamine-formaldehyde polymers are often particularly suitable. Such crosslinkers are commercially available, e.g. the melamine polymers, glycoluril polymers, urea-based polymer and benzoguanamine polymers, such as those sold by Cytec under tradenames Cymel 301, 303, 1170, 1171, 1172, 1123 and 1125 and Beetle 60, 65 and 80.

Particularly preferred photoresists of the invention may be used in immersion lithography applications. See, for example, U.S. Pat. No. 7,968,268 to Rohm and Haas Electronic Materials for a discussion of preferred immersion lithography photoresists and methods.

Photoresists of the invention also may comprise a single acid generator or a mixture of distinct acid generators, typically a mixture of 2 or 3 different acid generators, more typically a mixture that consists of a total of 2 distinct acid generators. The photoresist composition comprises an acid generator employed in an amount sufficient to generate a latent image in a coating layer of the composition upon exposure to activating radiation. For example, the acid generator will suitably be present in an amount of from 1 to 20 wt % based on total solids of the photoresist composition.

Suitable acid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-a-dimethylglyoxime, and bis-O-(n-butanesulfonyl)-a-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine.

As referred to herein, acid generators can produce an acid when exposed to activating radiation, such as EUV radiation, e-beam radiation, 193 nm wavelength radiation or other radiation sources. Acid generator compounds as referred to herein also may be referred to as photoacid generator compounds.

Photoresists of the invention also may contain other materials. For example, other optional additives include actinic and contrast dyes, anti-striation agents, plasticizers, speed enhancers and sensitizers. Such optional additives typically will be present in minor concentration in a photoresist composition.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, tris(2-hydroxypropyl)amine, oltetrakis(2-hydroxypropyl)ethylenediamine; aryl amines such as diphenylamine, triphenylamine, aminophenol, and 2-(4-aminophenyl)-2-(4-hydroxyphenyl)propane, a hindered amine such as diazabicycloundecene (DBU) or diazabicyclononene (DBN), or ionic quenchers including quaternary alkyl ammonium salts such as tetrabutylammonium hydroxide (TBAH) or tetrabutylammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Lithographic Processing

In use, a coating composition of the invention is applied as a coating layer to a substrate by any of a variety of methods such as spin coating. The coating composition in general is applied on a substrate with a dried layer thickness of between about 0.02 and 0.5 µm, preferably a dried layer thickness of between about 0.04 and 0.20 µm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the underlying coating composition. Cure conditions will vary with the components of the underlying coating composition. Particularly the cure temperature will depend on the specific acid or acid (thermal) generator that is employed in the coating composition. Typical cure conditions are from about 80° C. to 225° C. for about 0.5 to 5 minutes. Cure conditions preferably render the coating composition coating layer substantially insoluble to the photoresist solvent as well the developer solution to be used.

After such curing, a photoresist is applied above the surface of the applied coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation such as 248 nm, 193 nm or EUV radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed photoresist layer is then treated with a suitable developer capable of selectively removing portions of the film to form a photoresist pattern. In a negative tone development process, unexposed regions of a photoresist layer can be selectively removed by treatment with a suitable nonpolar solvent. See U.S. 2011/0294069 for suitable procedures for negative tone development. Typical nonpolar solvents for negative tone development are organic developers, such as a solvent chosen from ketones, esters, hydrocarbons, and mixtures thereof, e.g. acetone, 2-hexanone, 2-heptanone, methyl acetate, butyl acetate, and tetrahydrofuran. Photoresist materials used in the NTD process preferably form a photoresist layer that can form a negative image with organic solvent developer or a positive image with aqueous base developer such as tetraalkylammonium hydroxide solution. Preferably, the NTD photoresist is based on a polymer having acid sensitive (deprotectable) groups which, when deprotected, form carboxylic acid groups and/or hydroxyl groups.

Alternatively, development of the exposed photoresist layer can be accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups which form carboxylic acid groups when deprotected, and the developer is preferably a metal-ion free tetraalkylammonium hydroxide solution, such as, for example, aqueous 0.26 N tetramethylammonium hydroxide. A pattern forms by developing.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the underlying coating layer.

The following non-limiting examples are illustrative of the invention.

Example 1: Prepolymer Synthesis

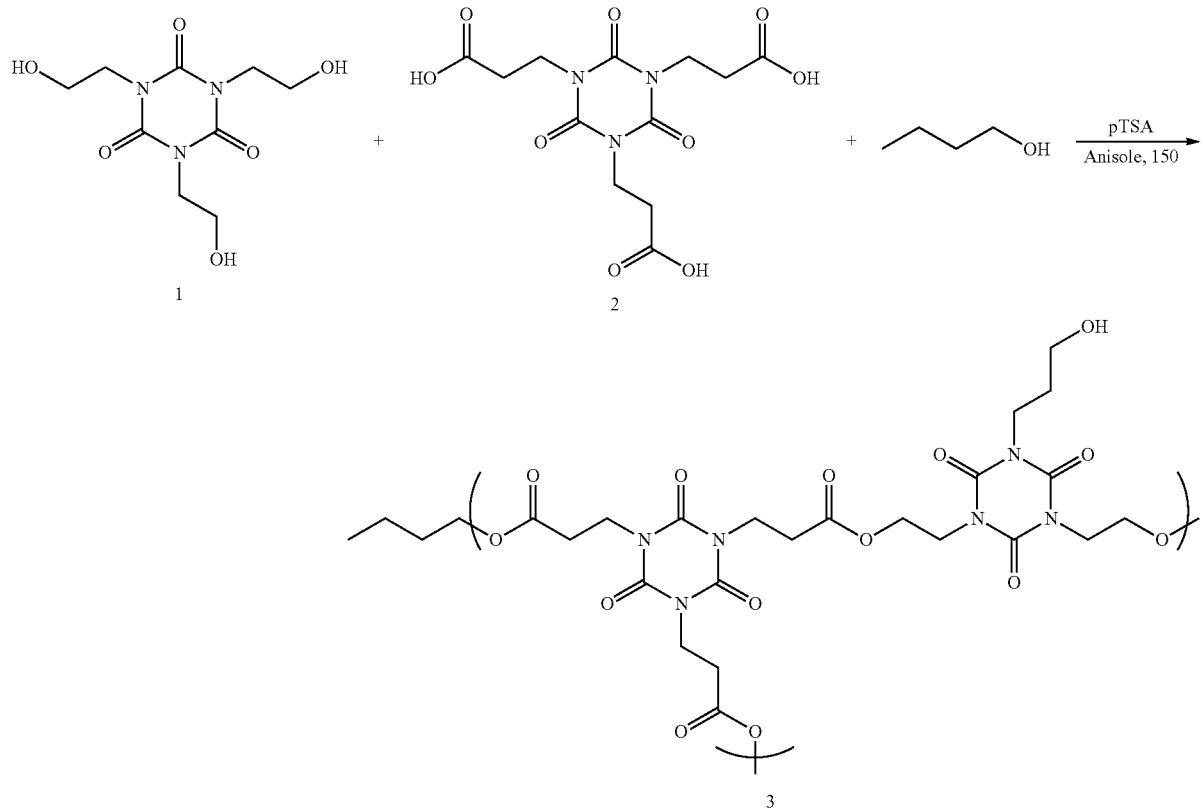

THEIC (Tris(2-hydroxyethyl) iso-cyanurate) 1 (30.43 g, 116.5 mmol), TCEIC 2 (Tris(2-carboxyethyl) iso-cyanurate) (20.11 g, 58.2 mmol), n-butanol (20.11 g, 271.5 mmol), p-TSA (p-toulenesulfonic acid) (0.53 g, 2.8 mmol) in 34 g of Anisole was dissolved. The reaction solution was then heated at 150° C. for 3 h. After 3 hours the temperature was reduced to 120° C. Then the solution was diluted by adding 78 g of HBM (2-hydroxyisobutyric acid methylester). A mixture of 80 g of HBM and 0.28 g of TEA (triethylamine) was then poured into the solution (approximately 200 g) that contained the copolymer 3.

Example 2: Crosslinker-Bound Polymer Synthesis I

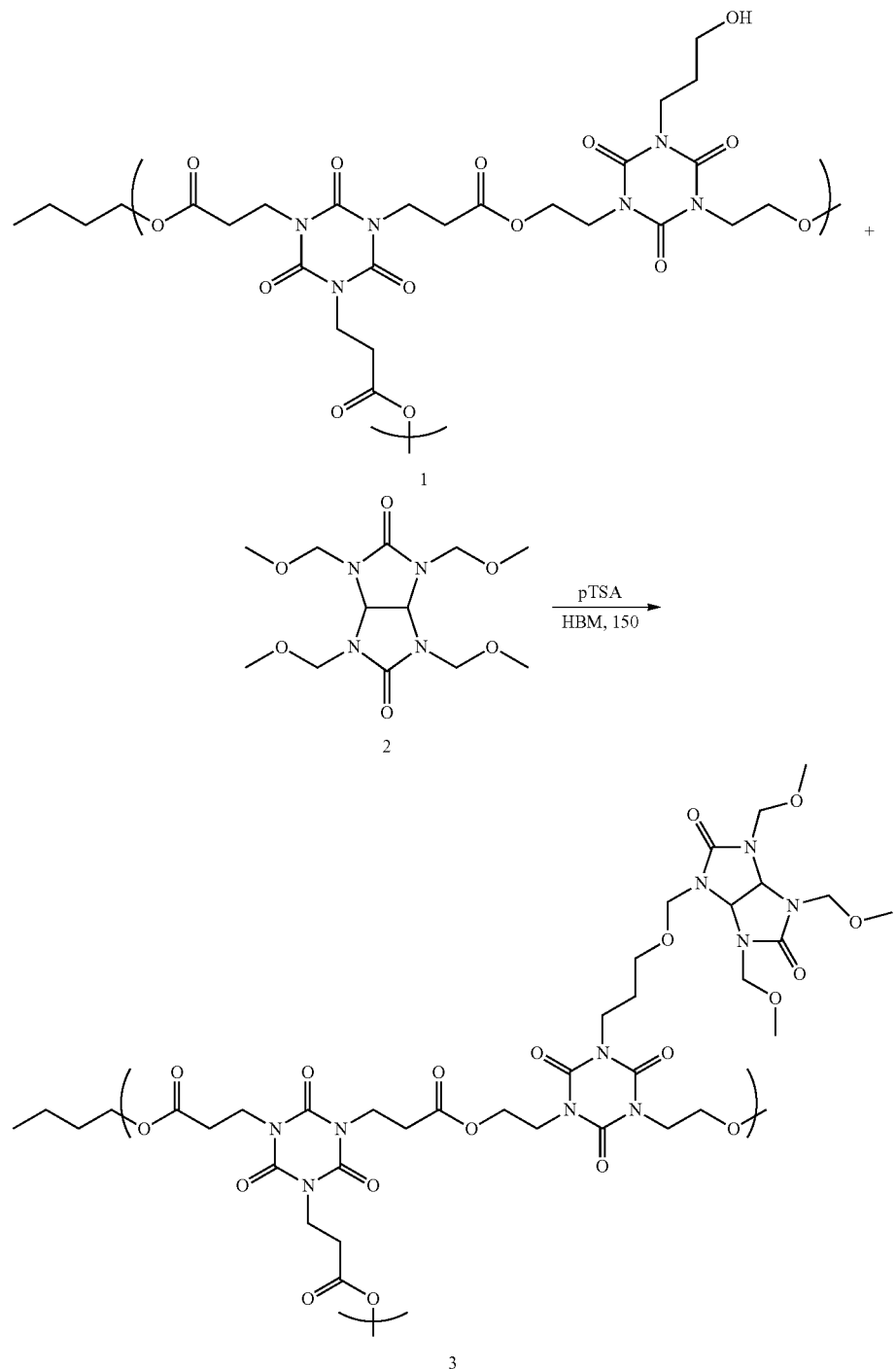

The prepolymer solution (containing resin 1) produced in Example 1 above (100 g) was heated to 50° C. X-linker 2 (1,3,4,6-tetrakis(methoxymethyl)tetrahydroimidazo[4,5-d]imidazole-2,5(1H,3H)-dione) (5.5 g, 17.3 mmol), pTSA (0.17 g, 0.8 mmol) was added into the solution. Then the solution was heated at 50° C. for 3 h. After 3 hours, the temperature was reduced to 20° C. Then, 0.17 g of TEA was added to the solution.

The polymer solution was dropped into a solvent blend of isopropanol (870 g) and heptane (580 g), and the resulting mixture was stirred for 0.5 h. The solid was filtered and dried under reduced pressure at 40° C. for 1 day.

The dried polymer 3 had the following characteristics: weight average molecular weight (Mw): 7500; polydispersity (PD): 2.5); weight percent glycoluril units based on total weight of the resin: 14.1%.

Example 3: Crosslinker-Bound Polymer Synthesis II (Formula (I))
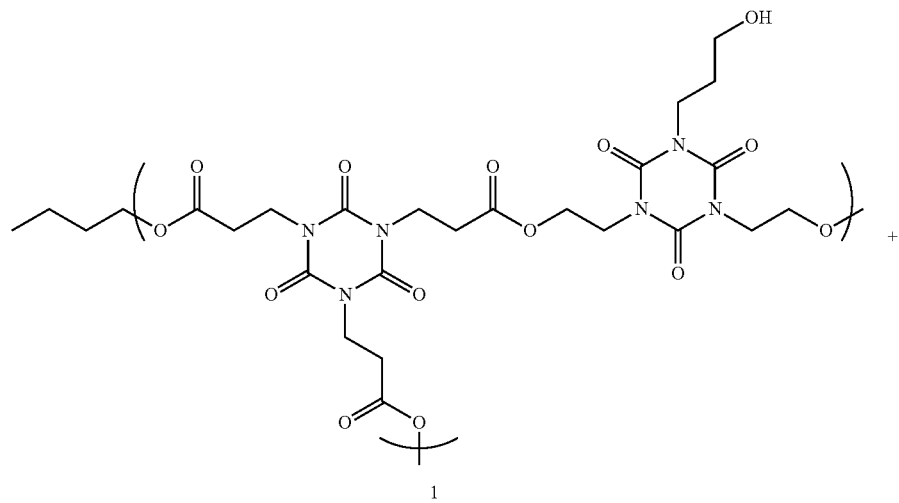
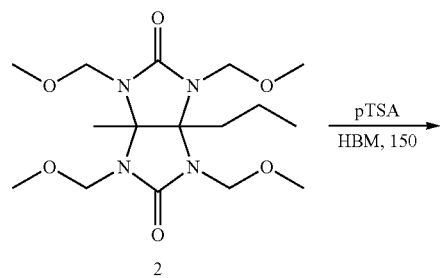
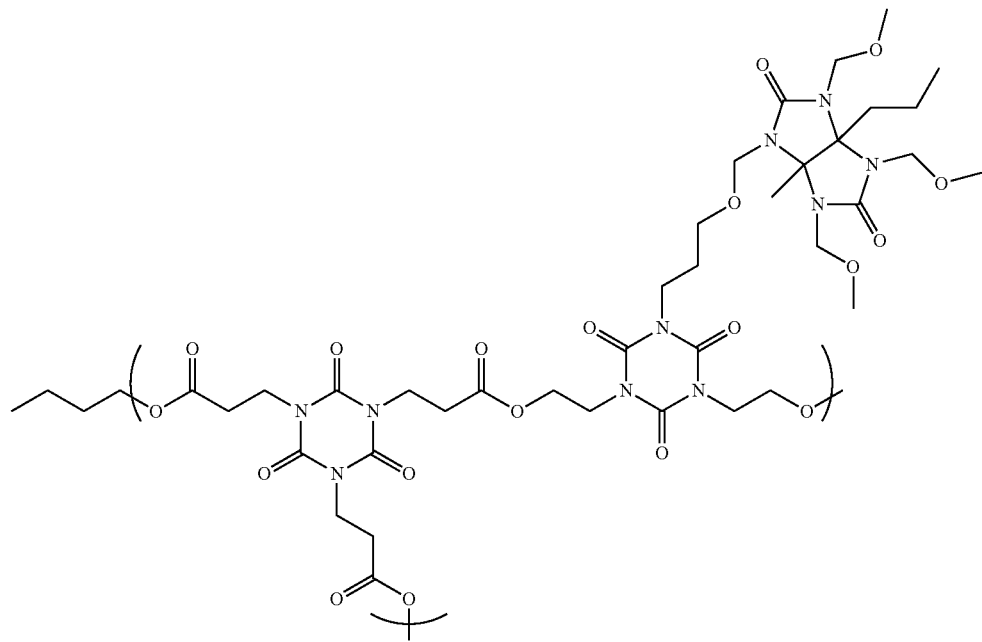

The prepolymer solution (containing resin 1) produced in Example 1 above (100 g) was heated to 50° C. X-linker 2 (1,3,4,6-tetrakis(methoxymethyl)-3a-methyl-6a-propyltetrahydroimidazo[4,5-d]imidazole-2,5(1H,3H)-dione) (6.5 g, 17.3 mmol) and pTSA (0.17 g, 0.8 mmol) were added into the solution. The reaction solution was then heated at 50° C. for 3 h. After 3 h, the temperature was reduced to 20° C. and 0.17 g of TEA was added to the solution.

The polymer solution was dropped into a solvent blend of isopropanol (870 g) and heptane (580 g). The mixture was then stirred for 0.5 hours. The solid was filtered and dried under reduced pressure at 40° C. for 1 day.

The dried polymer had the following characteristics: weight average molecular weight (Mw): 7950; polydispersity (PD): 2.3); weight percent glycoluril units based on total weight of the resin: 12.9%.

Example 4: Crosslinker-Bound Polymer Synthesis III (Formula (II))

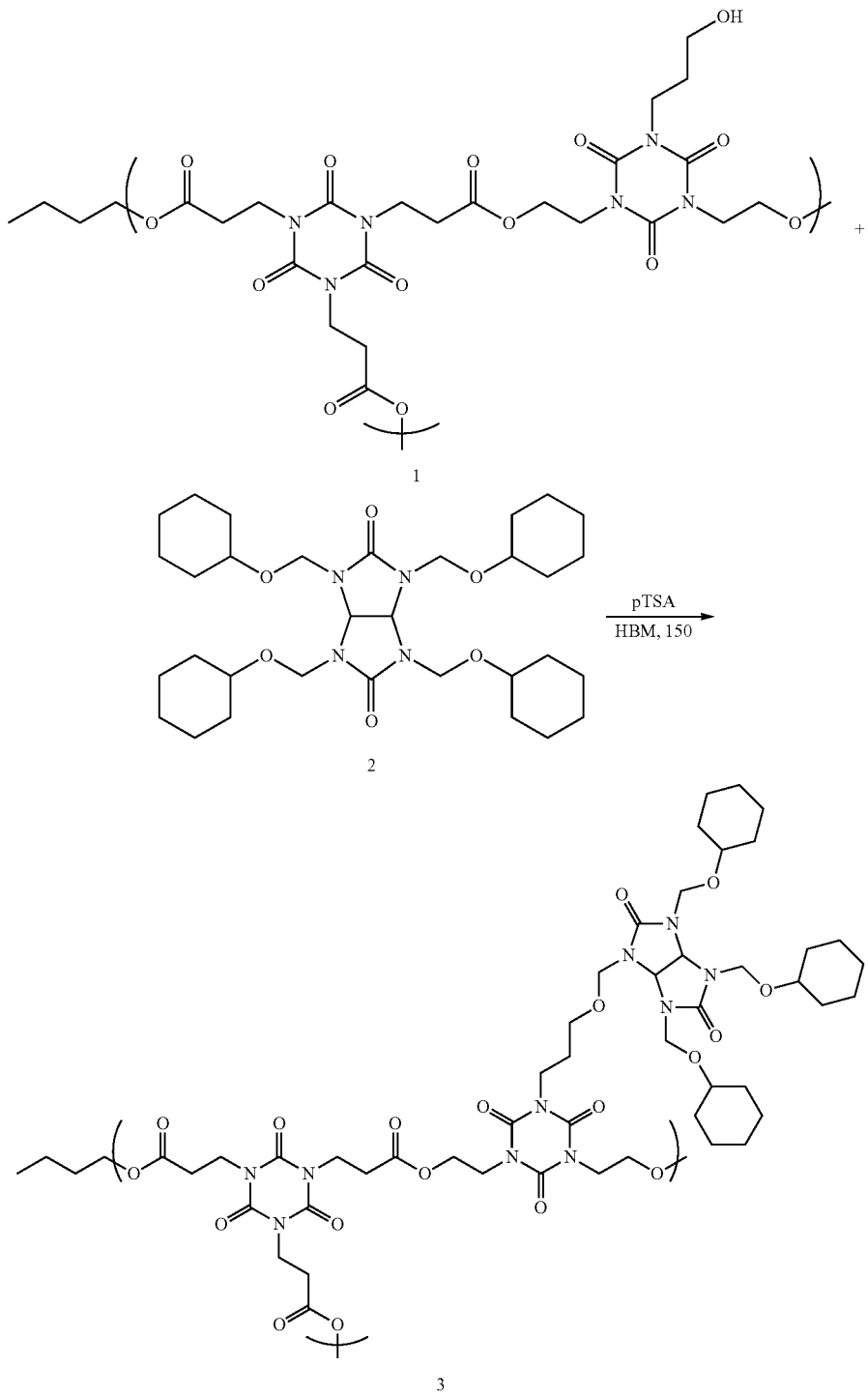

The prepolymer solution produced in Example 1 above 50 g) was heated to 50° C. The X-linker 2 (1,3,4,6-tetrakis ((cyclohexyloxy)methyl)tetrahydroimidazo[4,5-d]imidazole-2,5(1H,3H)-dione) (5.1 g, 17.3 mmol) and pTSA (0.11 g, 1.04 mmol) were added into the solution. The reaction solution was heated at 50° C. for 3 h. After 3 h, the temperature was temperature to 20° C. and 0.11 g of TEA was added into the solution to provide the above depicted resin 3 with covalently bound glycoluril.

Example 5: Comparative Solubility Test

Each of the glycoluril polymers of Examples 2 and 3 above were separately added to a formulation solvent blend of PGMEA:HBM=85:15 (v/v). The two polymer/solvent blend admixtures were agitated (shook) for one day. After 1 day, undissolved solid was filtered using syringe filter. After such filtering, solid percentages of the solvent bend admixture were measured by TGA with results as follows:

1) Solvent blend with glycoluril resin of Example 2: solid weight percent 18.2 percent.

2) Solvent blend with glycoluril resin of Example 3: solid weight percent 29.5 percent.

Example 6: Additional Comparative Solubility Test

Each of the glycoluril polymers of Examples 2 and 3 were separately formulated in the following solvent blends PGMEA:HBM=7:3 (v/v); 7.5:2.5 (v/v); 8:2 (v/v); 8.5:1.5 (v/v); 9:1 (v/v). Each of the glycoluril polymer/solvent formulations were prepared at 5 weight percent of glycoluril polymer based on total weight of the glycoluril polymer/solvent formulation. Formulations were stirred for one hour after admixing the solvent and polymer. After stirring, each of the formulations were visually (naked eye) inspected for undissolved (insoluble) polymer.

Results. For formulations that contained the glycoluril polymer of Example 2, insoluble polymer was seen at concentrations of PGMEA:HBM=8:0.2 (v/v) and higher. For formulations that contained the glycoluril polymer of Example 3, insoluble polymer was seen only at the concentration of PGMEA:HBM=9:1 (v/v).

Example 7: Preparation of Antireflective Coating Composition 0.53 g of the glycoluril-bound resin of Example 2, 0.006 g p-TSA benzylammonium salt, 0.001 g fluorochemical surfactant Polyfox 656 from OMNOVA solutions Inc., and 19.2 g methyl-2-hydroxy isobutyrate (HBM) are mixed to obtain a 3.8 wt % solution, based on total weight of the composition. The solution is filtered through a PTFE micro filter with 0.45 micron pore size to obtain the BARC composition.

Example 8. Lithography

The BARC composition of Example 6 is spin-coated on 150-mm silicon wafers at 1500 rpm, and then baked at 205° C. for 60 seconds using a TEL Mark 8 wafer coating track machine. The BARC coating thickness after bake is suitably about 1000 Å. Dow UV™ 1610 DUV photoresist is spin-coated on top of BARC coating and baked at 100° C. for 60 seconds. The photoresist layer is next exposed through a target mask using a 248 nm KrF wafer stepper with 0.65 NA. The photoresist layer is next post-exposure baked at 120° C. for 60 seconds, and then developed using Dow MF™ CD-26 TMAH developer in a standard 60 second single puddle process.

Example 9: Preparation of Antireflective Coating Composition and Lithography 0.53 g of the glycoluril-bound resin of Example 4, 0.006 g p-TSA benzylammonium salt, 0.001 g fluorochemical surfactant Polyfox 656 from OMNOVA solutions Inc., and 19.2 g methyl-2-hydroxy isobutyrate (HBM) are mixed to obtain a 3.8 wt % solution, based on total weight of the composition. The solution is filtered through a PTFE micro filter with 0.45 micron pore size to obtain the BARC composition. The antireflective composition is lithographically processed and imaged with a photoresist as described in Example 8 above.

What is claimed is:

1. A method, comprising:
   a) applying on a substrate a layer of a coating composition comprising a resin that comprises one or more glycoluril groups of Formula (I):

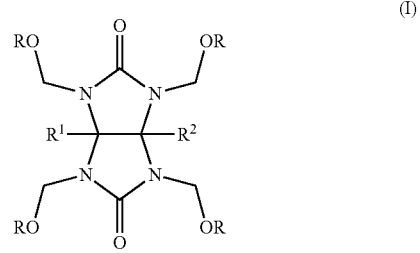

(I)

wherein in Formula (I):
at least one of $R^1$ and $R^2$ is other than hydrogen or a resin linker;
each R is the same or different and independently selected from a resin linker, hydrogen, optionally substituted alkyl, optionally substituted heteroalkyl, or optionally substituted carbocyclic aryl;
wherein at least one R group is an optionally substituted carbon alicyclic group, or an optionally substituted carbocyclic aryl group; and
b) applying a layer of a photoresist composition above the coating composition layer,
provided that one R is the resin linker, and the one or more glycouril groups are pendant moieties of a backbone of the resin.

2. The method of claim 1 wherein at least one of $R^1$ and $R^2$ is optionally substituted alkyl or optionally substituted heteroalkyl.

3. The method of claim 1 wherein the resin comprises 1) polyester linkages and/or 2) polymerized isocyanurate groups.

4. The method of claim 1 wherein the photoresist composition is imaged with activating radiation and the photoresist composition with activating radiation and developing the imaged photoresist composition layer to provide a photoresist relief image.

5. The method of claim 1 wherein the resin comprises a structure derived from formulae 1, 2, 3, 4, 5, 6, 7 or 8:

1

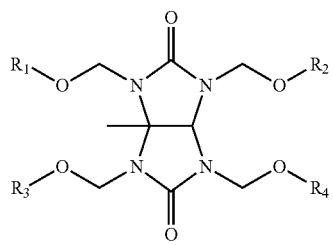

2

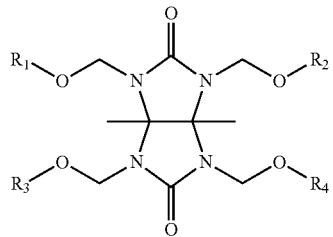

3

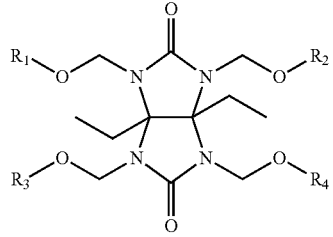

4

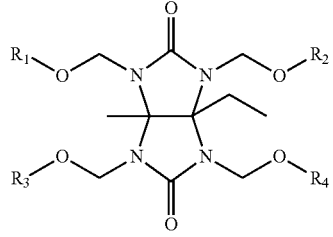

5

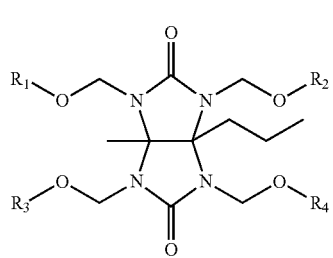

6

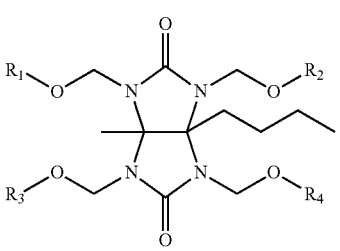

7

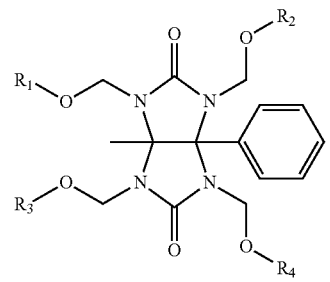

8

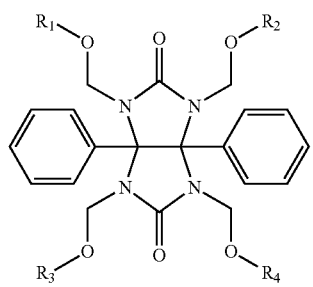

wherein in formulae 1, 2, 3, 4, 5, 6, 7 and 8, $R_1$, $R_2$, $R_3$ and $R_4$ are independently selected from a resin linker, hydrogen, optionally substituted alkyl, optionally substituted heteroalkyl, or optionally substituted carbocyclic aryl, and at least one of $R_1$, $R_2$, $R_3$ and $R_4$ is an optionally substituted carbon alicyclic group, an optionally substituted carbocyclic aryl group.

6. The method of claim 1 wherein in Formula (I) one or more R groups comprise an optionally substituted carbon alicyclic group.

7. The method of claim 1 wherein in Formula (I) one or more R groups comprise an optionally substituted heteroalkyl moiety.

8. The method of claim 1 wherein in Formula (I) one or more R groups comprise an optionally substituted alkoxy, optionally substituted alkylthio, or optionally substituted heteroalicyclic.

9. The method of claim 1 wherein the resin comprises a structure derived from one or more of the following:

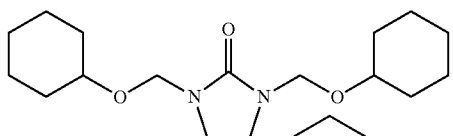
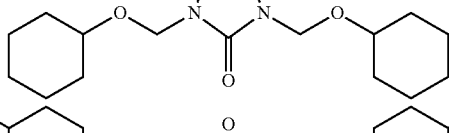
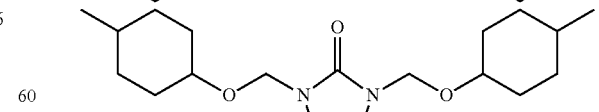
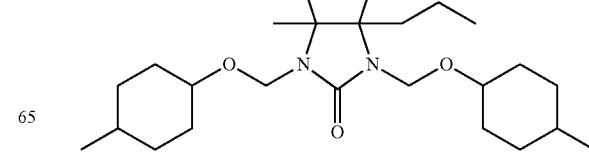

-continued

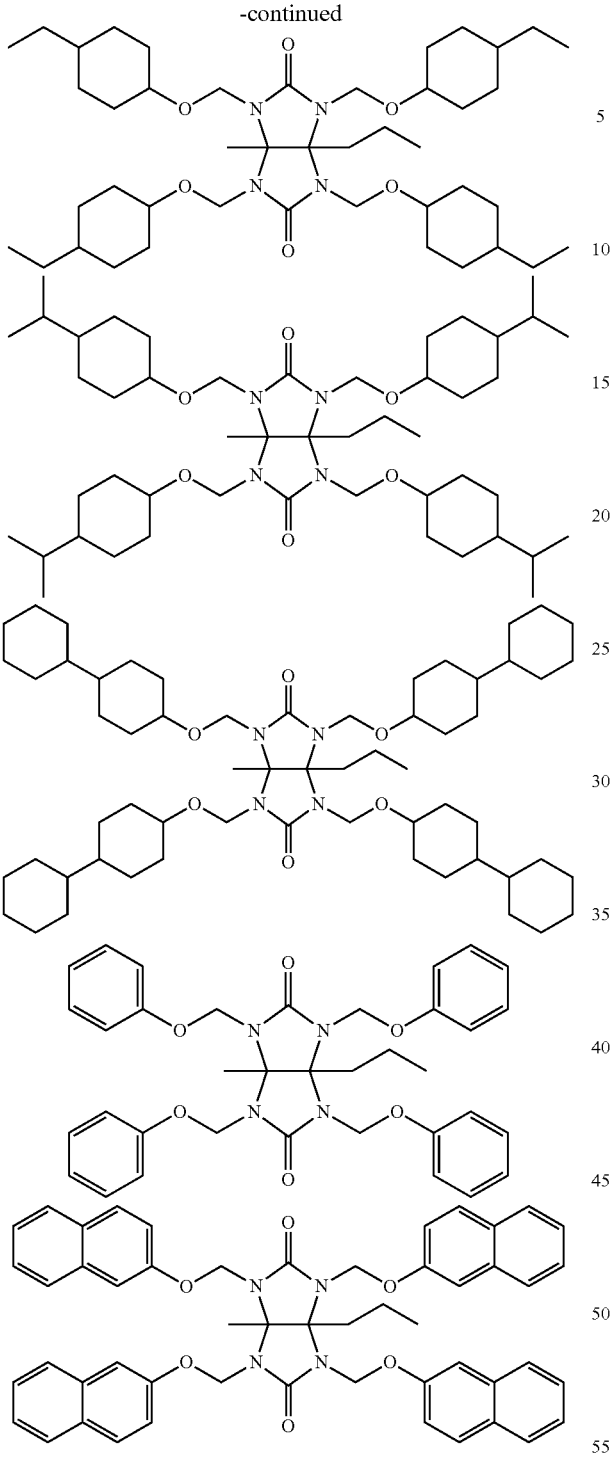

10. The method of claim 1 wherein in Formula (I) one or more R groups comprise an optionally substituted alkoxy.

11. The method of claim 1 wherein in Formula (I) one or more R groups comprise an optionally substituted alkylthio.

12. The method of claim 1 further comprising exposing the photoresist composition layer to patterned activating radiation.

13. The method of claim 12 wherein the resin comprises a chromophore group for the activating radiation.

14. The method of claim 1 wherein the resin comprises a phenyl group.

15. The method of claim 1 wherein one or more R groups comprise a carbocyclic aryl moiety.

16. The method of claim 1 wherein one or more R group is phenyl.

17. A method, comprising:
   a) applying on a substrate a layer of coating composition comprising a resin that comprises one or more glycoluril groups of Formula (I)

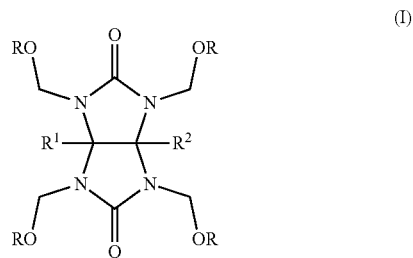

(I)

wherein in Formula (I):
   at least one of and $R^2$ and $R^2$ is other than hydrogen or a resin linker,
   each R is the same or different and independently selected from a resin linker, hydrogen, optionally substituted alkyl, optionally substituted heteroalkyl, or optionally substituted carbocyclic aryl,
   wherein at least one R group is an optionally substituted carbon alicyclic group, or an optionally substituted carbocyclic aryl group, and
   one or more R groups comprise an optionally substituted alkoxy or optionally substituted optionally substituted alkylthio; and
   b) applying a layer of a photoresist composition above the coating composition layer,
   provided that one R is the resin linker, and the one or more glycouril groups are pendant moieties of a backbone of the resin.

18. The method of claim 17 wherein in Formula (I) one or more R groups comprise an optionally substituted alkoxy.

19. The method of claim 17 wherein in Formula (I) one or more R groups comprise an optionally substituted alkylthio.

\* \* \* \* \*